(12) United States Patent
Yamakaji

(10) Patent No.: US 12,057,414 B2
(45) Date of Patent: Aug. 6, 2024

(54) PRINTED CIRCUIT BOARD

(71) Applicant: Mitsubishi Electric Corporation, Tokyo (JP)

(72) Inventor: Yusuke Yamakaji, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/284,861

(22) PCT Filed: Apr. 6, 2021

(86) PCT No.: PCT/JP2021/014662
§ 371 (c)(1),
(2) Date: Sep. 29, 2023

(87) PCT Pub. No.: WO2022/215176
PCT Pub. Date: Oct. 13, 2022

(65) Prior Publication Data
US 2024/0194617 A1    Jun. 13, 2024

(51) Int. Cl.
| | |
|---|---|
| H05K 1/18 | (2006.01) |
| H01L 23/367 | (2006.01) |
| H01L 23/498 | (2006.01) |
| H01L 23/66 | (2006.01) |
| H01R 12/75 | (2011.01) |

(52) U.S. Cl.
CPC .......... *H01L 23/66* (2013.01); *H01L 23/3672* (2013.01); *H01L 23/49838* (2013.01); *H01R 12/75* (2013.01); *H01L 2223/6661* (2013.01)

(58) Field of Classification Search
CPC .......... H05K 1/18; H05K 1/181; H05K 1/162
See application file for complete search history.

(56) References Cited

U.S. PATENT DOCUMENTS 6,016,083 A * 1/2000 Satoh ................... H05K 9/0018
333/182
6,198,362 B1    3/2001 Harada et al.
(Continued)

FOREIGN PATENT DOCUMENTS

| JP | H11-261181 A | 9/1999 |
|---|---|---|
| JP | 2008-130584 A | 6/2008 |

(Continued)

OTHER PUBLICATIONS

International Preliminary Report on Patentability Chapter I mailed on Oct. 19, 2023, received for PCT Application PCT/JP2021/014662, filed on Apr. 6, 2021, 10 pages including English Translation.
(Continued)

*Primary Examiner* — Sherman Ng
(74) *Attorney, Agent, or Firm* — XSENSUS LLP

(57) ABSTRACT

A printed circuit board includes a printed board, a first integrated circuit chip, a connector, and a capacitor. The printed board includes a first ground pattern and a second ground pattern directly opposed to the first ground pattern. The second ground pattern is electrically connected with a chassis or connector ground wiring. The capacitor is connected to the first ground pattern and the second ground pattern and disposed on a straight line that defines the shortest distance between the first ground terminal and the second ground pattern.

17 Claims, 16 Drawing Sheets

(56) References Cited

U.S. PATENT DOCUMENTS

| | | | | |
|---|---|---|---|---|
| 9,433,083 B2* | 8/2016 | Moncayo | ............... | H05K 1/025 |
| 2007/0123074 A1* | 5/2007 | Nishimura | ........... | H05K 1/0231 |
| | | | | 439/108 |
| 2014/0049929 A1* | 2/2014 | Yamaguchi | .......... | H05K 1/0216 |
| | | | | 361/782 |
| 2018/0233838 A1* | 8/2018 | Ishimatsu | .............. | H01R 12/53 |
| 2019/0132941 A1* | 5/2019 | Mu | ...................... | H05K 1/0219 |
| 2021/0307216 A1 | 9/2021 | Toyama et al. | | |

FOREIGN PATENT DOCUMENTS

| | | | |
|---|---|---|---|
| JP | 2010-040787 A | 2/2010 | |
| JP | 2010-050298 A | 3/2010 | |
| JP | 2011-211147 A | 10/2011 | |
| JP | 2012-253054 A | 12/2012 | |
| JP | 2013-012528 A | 1/2013 | |
| JP | 2014-197648 A | 10/2014 | |
| JP | 2016-219553 A | 12/2016 | |
| JP | 2018-032712 A | 3/2018 | |
| JP | 2019-169646 A | 10/2019 | |
| JP | 2020-053491 A | 4/2020 | |
| JP | 6843312 B1 | 3/2021 | |

OTHER PUBLICATIONS

International Search Report and Written Opinion mailed on Jun. 22, 2021, received for PCT Application PCT/JP2021/014662, filed on Apr. 6, 2021, 8 pages including English Translation.

Notice of Reasons for Refusal mailed on Jun. 27, 2023, received for JP Application 2023-512557, 11 pages including English Translation.

\* cited by examiner

PRINTED CIRCUIT BOARD

CROSS-REFERENCE TO RELATED APPLICATION

This application is based on PCT filing PCT/JP2021/014662, filed Apr. 6, 2021, the entire contents of which are incorporated herein by reference.

TECHNICAL FIELD

The present disclosure relates to a printed circuit board.

BACKGROUND ART

Japanese Patent Laying-Open No. 2020-53491 (PTL 1) discloses an electronic control device including a metal housing and a printed circuit board. The housing includes a housing upper portion and a housing lower portion. The housing lower portion is fixed to the housing upper portion using a plurality of screws. The printed circuit board is disposed inside the housing. A connector is provided on the printed circuit board. A ground pattern and a guard pattern are formed on the printed circuit board. The guard pattern is formed in an outer peripheral portion of the printed circuit board and separates from the ground pattern. The ground pattern and the guard pattern are connected to each other through a capacitor in the vicinity of an intermediate point of fixed positions where the housing upper portion and the housing lower portion are fixed to each other.

CITATION LIST

Patent Literature

PTL 1: Japanese Patent Laying-Open No. 2020-53491

SUMMARY OF INVENTION

Technical Problem

When an integrated circuit chip is mounted on the printed circuit board of the electronic control device disclosed in PTL 1, the ground pattern supplies a reference potential of the integrated circuit chip. In this electronic control device, electromagnetic noise may sometimes propagate to the ground pattern through an electric cable connected to the connector. If electromagnetic noise propagates to the entire ground pattern, malfunction or electrical breakdown of an electronic component may sometimes occur. The present disclosure is made in view of the problem above, and the object of the present disclosure is to provide a printed circuit board capable of preventing malfunction or electrical breakdown of an electronic component electrically connected with a ground pattern.

Solution to Problem

A printed circuit board according to the present disclosure includes a printed board, a first integrated circuit chip, a connector, and a first capacitor. The printed board includes an insulating substrate including a first main surface, a first ground pattern, a second ground pattern, and a first signal line pattern. The first integrated circuit chip is mounted on the printed board. The connector is mounted on the printed board and connectable to an electric cable. The first capacitor is mounted on the printed board. In a plan view of the first main surface, the first ground pattern has a wider area than the second ground pattern. The second ground pattern separates from the first ground pattern and is directly opposed to the first ground pattern in the plan view of the first main surface. The first signal line pattern is insulated from the first ground pattern and the second ground pattern. The connector includes a chassis, connector ground wiring provided inside the chassis, and first connector signal wiring provided inside the chassis. The first integrated circuit chip includes a first ground terminal and a first signal terminal. The first ground terminal is electrically connected with the first ground pattern and opposed to the second ground pattern in the plan view of the first main surface. The first signal terminal is electrically connected with the first connector signal wiring through the first signal line pattern. The second ground pattern is electrically connected with the chassis or the connector ground wiring. The first capacitor is connected to the first ground pattern and the second ground pattern and disposed on a straight line that defines a shortest distance between the first ground terminal and the second ground pattern in the plan view of the first main surface.

Advantageous Effects of Invention

Thus, electromagnetic noise from an electric cable into the first integrated circuit chip does not spread to the entire first ground pattern but flows into the second ground pattern through the first capacitor. In the printed circuit board of the present disclosure, malfunction or electrical breakdown of an electronic component (for example, the first integrated circuit chip) electrically connected with the first ground pattern can be prevented.

DESCRIPTION OF EMBODIMENTS

Figure 1:
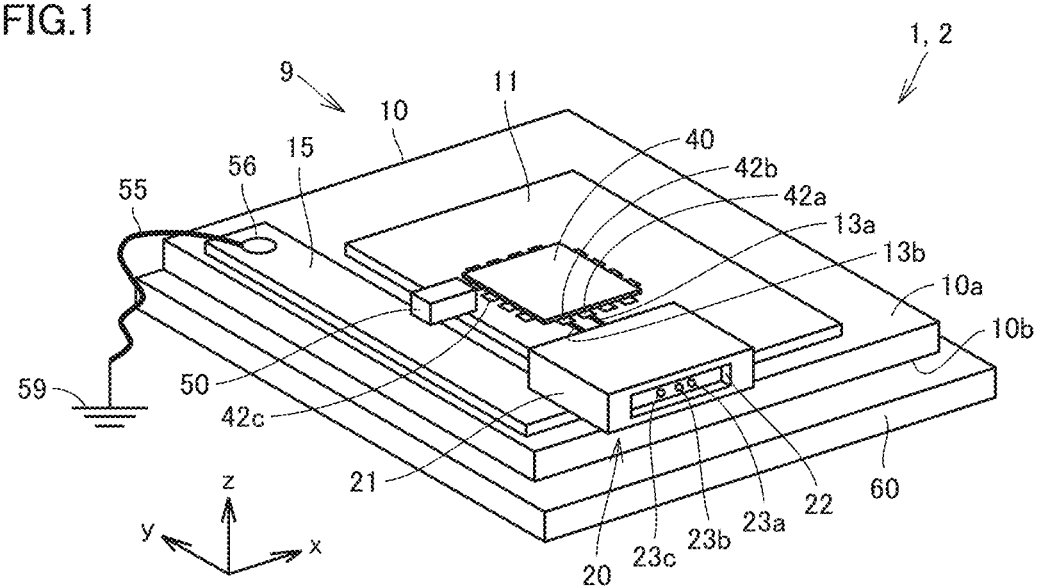
FIG. 1 is a perspective view of an electronic device in a first embodiment.

Embodiments of the present disclosure will be described below. The same configuration is denoted by the same reference numeral and a description thereof is not repeated.

First Embodiment

Referring to FIG. 1 to FIG. 10, a printed circuit board 1 in a first embodiment will be described. Printed circuit board 1 is applied to, for example, an electronic device 2. Electronic device 2 may be, for example, but is not limited to, a control device for factory automation (FA) systems, an electronic device having a touch panel, such as a smartphone, an electronic device installed in an environment in which electromagnetic noise occurs, such as a power plant or a factory, an electronic device installed in automobiles, aircrafts, or artificial satellites, or a consumer device such as an air conditioner. Electronic device 2 includes, for example, a printed circuit board 1 and a housing 60. Printed circuit board 1 is fixed, for example, on housing 60.

Printed circuit board 1 mainly includes a printed board 9, a connector 20, a first integrated circuit chip 40, and a capacitor 50.

Printed board 9 includes an insulating substrate 10, a first ground pattern 11, a second ground pattern 15, and at least one first signal line pattern.

Insulating substrate 10 is, for example, a glass epoxy substrate such as FR-4 substrate, a glass composite substrate such as CEM-3 substrate, a paper phenol substrate such as FR-1 substrate, or a paper epoxy substrate. Insulating substrate 10 has, for example, a relative permittivity of 3.0 or more and 5.0 or less.

Insulating substrate 10 includes a first main surface 10a and a second main surface 10b opposite first main surface 10a. In a plan view of first main surface 10a of insulating substrate 10, insulating substrate 10 (printed board 9) has, for example, a rectangular shape. First main surface 10a and second main surface 10b each extend along a first direction (x direction) and a second direction (y direction) intersecting the first direction (x direction). In particular, the second direction (y direction) is perpendicular to the first direction (x direction). The thickness direction of the insulating substrate 10 is a third direction (z direction) perpendicular to the first direction (x direction) and the second direction (y direction). Insulating substrate 10 includes an outer edge portion 10c in which connector 20 is disposed.

The size of each side of insulating substrate 10 (printed board 9) in a plan view of first main surface 10a of insulating substrate 10 is, for example, 5 cm or more. The size of each side of insulating substrate 10 (printed board 9) in a plan view of first main surface 10a of insulating substrate 10 is, for example, 30 cm or less. The size of each side of insulating substrate 10 (printed board 9) in a plan view of first main surface 10a of insulating substrate 10 may be 15 cm or less.

First ground pattern 11 is formed of, for example, a conductive material such as copper or aluminum. First ground pattern 11 is electrically connected with a first ground terminal 42c of first integrated circuit chip 40 and provides a reference potential to first integrated circuit chip 40. Because of the residual inductance of a conductor (for example, conductive wire 55), the reference potential provided by first ground pattern 11 to first integrated circuit chip 40 is different from a reference potential 59 described later, for AC voltage. First ground pattern 11 is provided, for example, on first main surface 10a. In a plan view of first main surface 10a of insulating substrate 10, first ground pattern 11 is disposed at the center of insulating substrate 10 relative to second ground pattern 15.

In a plan view of first main surface 10a of insulating substrate 10, first ground pattern 11 has a wider area than second ground pattern 15. In other words, in a plan view of first main surface 10a of insulating substrate 10, first ground pattern 11 has a larger width than second ground pattern 15. First ground pattern 11 has a larger cross-sectional area than second ground pattern 15. Thus, first ground pattern 11 has a smaller residual inductance than second ground pattern 15. The cross-sectional area of first ground pattern 11 means, for example, the area of first ground pattern 11 in a cross section perpendicular to first main surface 10a of insulating substrate 10 and the lengthwise direction of first ground pattern 11. The cross-sectional area of second ground pattern 15 means, for example, the area of second ground pattern 15 in a cross section perpendicular to first main surface 10a of insulating substrate 10 and the lengthwise direction of second ground pattern 15.

In a plan view of first main surface 10a of insulating substrate 10, first ground pattern 11 includes an outer edge portion 11a, an outer edge portion 11b opposite outer edge portion 11a, and an outer edge portion 11c. Outer edge portion 11a is opposed to outer edge portion 10c of insulating substrate 10. Outer edge portion 11a is, for example, a portion nearest to outer edge portion 10c of insulating substrate 10, in the outer edge of first ground pattern 11. Outer edge portion 11b is, for example, a portion farthest from outer edge portion 10c insulating substrate 10, in the outer edge of first ground pattern 11. Outer edge portion 11a and outer edge portion 11b extend, for example, along the first direction (x direction). Outer edge portion 11c is connected to outer edge portion 11a and outer edge portion 11b. Outer edge portion 11c extends in a direction different from outer edge portion 11a and outer edge portion 11b. Outer edge portion 11c extends, for example, along the second direction (y direction).

Second ground pattern 15 is formed of, for example, a conductive material such as copper or aluminum. Second ground pattern 15 is provided, for example, on first main surface 10a. In a plan view of first main surface 10a of insulating substrate 10, second ground pattern 15 is disposed in an outer peripheral region of insulating substrate 10 relative to first ground pattern 11. Second ground pattern 15 extends, for example, along outer edge portion 11c of first ground pattern 11. Second ground pattern 15 extends, for example, along the second direction (y direction). Second ground pattern 15 may have, for example, a stripe shape. The lengthwise direction of second ground pattern 15 is, for example, the second direction (y direction). The widthwise direction of second ground pattern 15 is, for example, the first direction (x direction).

Second ground pattern 15 separates from first ground pattern 11 (outer edge portion 11c), for example, in the first direction (x direction). Second ground pattern 15 is directly opposed to first ground pattern 11 (outer edge portion 11c) in a plan view of first main surface 10a of insulating substrate 10. In other words, in a plan view of first main surface 10a of insulating substrate 10, printed board 9 does not include a conductive pattern between first ground pattern 11 (outer edge portion 11c) and second ground pattern 15. No electronic component (excluding capacitor 50) is disposed on second ground pattern 15 or above second ground pattern 15 in a plan view of first main surface 10a of insulating substrate 10.

Second ground pattern 15 is electrically connected to reference potential 59 such as ground potential. Specifically, second ground pattern 15 is connected to the ground potential through a conductor such as grounded conductor. The ground potential is the potential of the earth. The conductor is, for example, conductive wire 55. Because of the residual inductance of the conductor (for example, conductive wire 55), the potential of second ground pattern 15 is different from reference potential 59 for AC voltage.

Specifically, the conductor (for example, conductive wire 55) is fixed to second ground pattern 15, using a fixing member 56 such as a screw. As an example, a screw is threaded in a screw hole provided in insulating substrate 10. Conductive wire 55 is sandwiched between the head of the screw and second ground pattern 15. The conductor (for example, conductive wire 55) is fixed, for example, to a distal end of second ground pattern 15 relative to outer edge portion 11a of first ground pattern 11 (outer edge portion 10c of insulating substrate 10) (a proximal end of second ground pattern 15 relative to outer edge portion 11b of first ground pattern 11). The conductor (for example, conductive wire 55) is also in contact with housing 60 of electronic device 2.

Second ground pattern 15 is electrically connected with a chassis 21 or connector ground wiring 25c of connector 20. Thus, when an electric cable 30 is connected to connector 20, second ground pattern 15 is electrically connected with a sheath 32 of electric cable 30 through a terminal 24c, chassis 21, and a connector body 31 of electric cable 30. Alternatively, when electric cable 30 is connected to connector 20, second ground pattern 15 is electrically connected with cable ground wiring 35c of electric cable 30 through terminal 24c, connector ground wiring 25c, a terminal 23c, and a terminal 33c.

At least one first signal line pattern (for example, first signal line patterns 13a, 13b) is formed of, for example, a conductive material such as copper or aluminum. At least one first signal line pattern is provided, for example, on first main surface 10a. At least one first signal line pattern separates from first ground pattern 11 and second ground pattern 15 and is insulated from first ground pattern 11 and second ground pattern 15. At least one first signal line pattern corresponds to at least one first cable signal wiring. Printed board 9 includes, for example, two first signal line patterns 13a, 13b.

Connector 20 is mounted on printed board 9. Connector 20 is connectable to electric cable 30. For example, connector 20 may be a receptacle that can receive connector body 31 of electric cable 30. Connector 20 is electrically insulated from first ground pattern 11. Connector 20 includes, for example, chassis 21, at least one first connector signal wiring (for example, first connector signal wiring 25a, 25b), and terminals 23a, 23b, 24a, 24b. Connector 20 may further include connector ground wiring 25c and terminals 23c, 24c.

Chassis 21 may be a conductive chassis such as metal chassis or may be an insulated chassis formed of an insulator such as insulating resin. When connector 20 is a receptacle, chassis 21 has a receiving section 22 that can receive a plug of electric cable 30.

At least one first connector signal wiring (for example, first connector signal wiring 25a, 25b) is provided inside chassis 21. At least one first connector signal wiring corresponds to at least one first cable signal wiring. Connector 20 includes, for example, two sets of first connector signal wiring 25a, 25b. First connector signal wiring 25a is connected to terminal 23a and terminal 24a. First connector signal wiring 25b is connected to terminal 23b and terminal 24b. Terminal 24a is in contact with first signal line pattern 13a and electrically connected with first signal line pattern 13a. Terminal 24b is in contact with first signal line pattern 13b and electrically connected with first signal line pattern 13b.

Connector ground wiring 25c is provided inside chassis 21. Connector ground wiring 25c is connected to terminal 23c and terminal 24c. Terminal 24c is in contact with second ground pattern 15 and electrically connected with second ground pattern 15.

Electric cable 30 includes, for example, connector body 31, sheath 32, at least one first cable signal wiring (for example, first cable signal wiring 35a, 35b), and terminals 33a, 33b. Electric cable 30 may further include cable ground wiring 35c and terminal 33c.

Connector body 31 may be, for example, a plug inserted into receiving section 22 of chassis 21. Sheath 32 is connected to connector body 31 and accommodates at least one first cable signal wiring (for example, first cable signal wiring 35a, 35b). Sheath 32 may further accommodate cable ground wiring 35c. Sheath 32 may be formed of a conductive material such as metal and may be a conductive sheath. Sheath 32 may be formed of an insulating material such as insulating resin and may be an insulated sheath.

Electric cable 30 includes, for example, two sets of first cable signal wiring 35a, 35b. First cable signal wiring 35a, 35b is, for example, a pair of differential signal wiring. First cable signal wiring 35a is connected to terminal 33a. First cable signal wiring 35b is connected to terminal 33b. When electric cable 30 is connected to connector 20, terminal 33a comes into contact with terminal 23a, and terminal 33b comes into contact with terminal 23b. In this way, first cable signal wiring 35a is electrically connected with first connector signal wiring 25a through terminal 33a and terminal 23a. First cable signal wiring 35b is electrically connected with first connector signal wiring 25b through terminal 33b and terminal 23b.

Cable ground wiring 35c is connected to terminal 33c. When electric cable 30 is connected to connector 20, terminal 33c comes into contact with terminal 23c. In this way, cable ground wiring 35c is electrically connected with connector ground wiring 25c through terminal 33c and terminal 23c.

First integrated circuit chip 40 is for example, but not limited to, an application-specific integrated circuit (ASIC) chip including a communication circuit. First integrated circuit chip 40 is mounted on printed board 9. First integrated circuit chip 40 is disposed on first ground pattern 11. In a plan view of first main surface 10a of insulating substrate 10, first integrated circuit chip 40 is disposed inside the outer edge of first ground pattern 11. First integrated circuit chip 40 includes at least one first signal terminal (for example, first signal terminals 42a, 42b) and first ground terminal 42c.

At least one first signal terminal (for example, first signal terminals 42a, 42b) corresponds to at least one first signal line pattern (for example, first signal line patterns 13a, 13b). At least one first signal terminal is electrically connected with at least one first connector signal wiring (for example, first connector signal wiring 25a, 25b) through at least one first signal line pattern.

For example, first integrated circuit chip 40 includes two first signal terminals 42a, 42b. First signal terminal 42a is in contact with first signal line pattern 13a and electrically connected with first signal line pattern 13a. First signal terminal 42a is electrically connected with first connector signal wiring 25a through first signal line pattern 13a and terminal 24a. First signal terminal 42b is in contact with first signal line pattern 13b and electrically connected with first signal line pattern 13b. First signal terminal 42b is electrically connected with first connector signal wiring 25b through first signal line pattern 13b and terminal 24b.

First ground terminal 42c is in contact with first ground pattern 11 and electrically connected with first ground pattern 11. First ground terminal 42c is opposed to second ground pattern 15 in a plan view of first main surface 10a of insulating substrate 10. For example, first ground terminal 42c is opposed to the second ground pattern in the first direction (x direction).

High-frequency electromagnetic noise from a typical electronic device or the like (for example, common-mode electromagnetic noise with a frequency of 1 MHz or higher) flows from connector 20 into printed board 9. The shortest distance between first ground terminal 42c and second ground pattern 15 is, for example, one-tenth or less of the electrical length of this electromagnetic noise inside printed board 9. The shortest distance between first ground terminal 42c and second ground pattern 15 may be one-twentieth or less of the electrical length, one-fiftieth or less of the electrical length, or one-hundredth or less of the electrical length. For example, when the relative permittivity of printed board 9 is 4 and the frequency of electromagnetic noise is 100 MHz, the electrical length inside printed board 9 is approximately 1.5 m.

Capacitor 50 is, for example, a multilayer ceramic capacitor or an aluminum electrolytic capacitor. Capacitor 50 is mounted on printed board 9. Capacitor 50 is connected to first ground pattern 11 and second ground pattern 15. Capacitor 50 may be the only capacitor that is connected to first ground pattern 11 and second ground pattern 15.

The capacity of capacitor 50 is, for example, 0.5 µF or more. In particular, the capacity of capacitor 50 may be, for example, 0.9 µF or more.

In general, as the frequency of AC voltage through a capacitor increases, the impedance of the capacitor decreases. Electromagnetic noise from a typical electronic device has a relatively high frequency (for example, 1 MHz or higher). This high-frequency electromagnetic noise propagating through sheath 32 of electric cable 30 is coupled to first cable signal wiring 35a, 35b due to parasitic capacitance inside electric cable 30 or coupled to first connector signal wiring 25a, 25b due to parasitic capacitance inside connector 20. In this way, the high-frequency electromagnetic noise flows from electric cable 30 into first signal line patterns 13a, 13b and first ground pattern 11.

In general, as the capacity of a capacitor decreases, the impedance of the capacitor increases. Since the capacity of capacitor 50 is 0.5 µF or more, excessive increase in impedance of capacitor 50 for this high-frequency electromagnetic noise is prevented. The high-frequency electromagnetic noise easily flows from first ground pattern 11 to second ground pattern 15 through capacitor 50. Capacitor 50 having a capacity of 0.5 µF or more can prevent the high-frequency electromagnetic noise flowing into first ground pattern 11 from spreading to the entire first ground pattern 11 and enables the high-frequency electromagnetic noise to escape to the outside of printed circuit board 1 (for example, reference potential 59) via capacitor 50 and second ground pattern 15. Variation in potential of first ground pattern 11 resulting from high-frequency electromagnetic noise is suppressed, and malfunction or electrical breakdown of first integrated circuit chip 40 electrically connected with first ground pattern 11 can be prevented.

The capacity of capacitor 50 is, for example, 5.0 µF or less. In particular, the capacity of capacitor 50 may be, for example, 2.0 µF or less or may be 1.1 µF or less.

In general, as the frequency of AC voltage through a capacitor decreases, the impedance of the capacitor increases. Electromagnetic noise resulting from lightning or the like has a relatively low frequency (for example, 100 kHz or lower). This low-frequency electromagnetic noise propagating through sheath 32 of electric cable 30 does not flow into first connector signal wiring 25a, 25b and first signal line pattern 13a, 13b due to parasitic capacitance inside electric cable 30 or parasitic capacitance inside connector 20 but flows into second ground pattern 15 through chassis 21.

In general, the capacity of a capacitor increases, the impedance of the capacitor decreases. Since the capacity of capacitor 50 is 5.0 µF or less, an excessive decrease in impedance of capacitor 50 for the low-frequency electromagnetic noise is prevented. Capacitor 50 having a capacity of 5.0 µF or less prevents the low-frequency electromagnetic noise from flowing from second ground pattern 15 into first ground pattern 11 through capacitor 50 and enables the low-frequency electromagnetic noise to escape to the outside of printed circuit board 1 (for example, reference potential 59). Variation in potential of first ground pattern 11 resulting from low-frequency electromagnetic noise is suppressed, and malfunction or electrical breakdown of an electronic component (for example, first integrated circuit chip 40) can be prevented that is electrically connected with first ground pattern 11.

Further, since the capacity of capacitor 50 is 5.0 µF or less, a capacitor having a high withstand voltage (for example, a withstand voltage of 500 V or higher) can be used as capacitor 50. Electromagnetic noise that can be released from first ground pattern 11 to second ground pattern 15 can be increased.

In a plan view of first main surface 10a of insulating substrate 10, capacitor 50 is disposed on a straight line 50a that defines the shortest distance between first ground terminal 42c and second ground pattern 15. Straight line 50a extends, for example, along the first direction (x direction).

Referring to FIG. 3 to FIG. 8, the operation of printed circuit board 1 in the present embodiment will be compared to a printed circuit board 1a in a comparative example.

Figure 3:
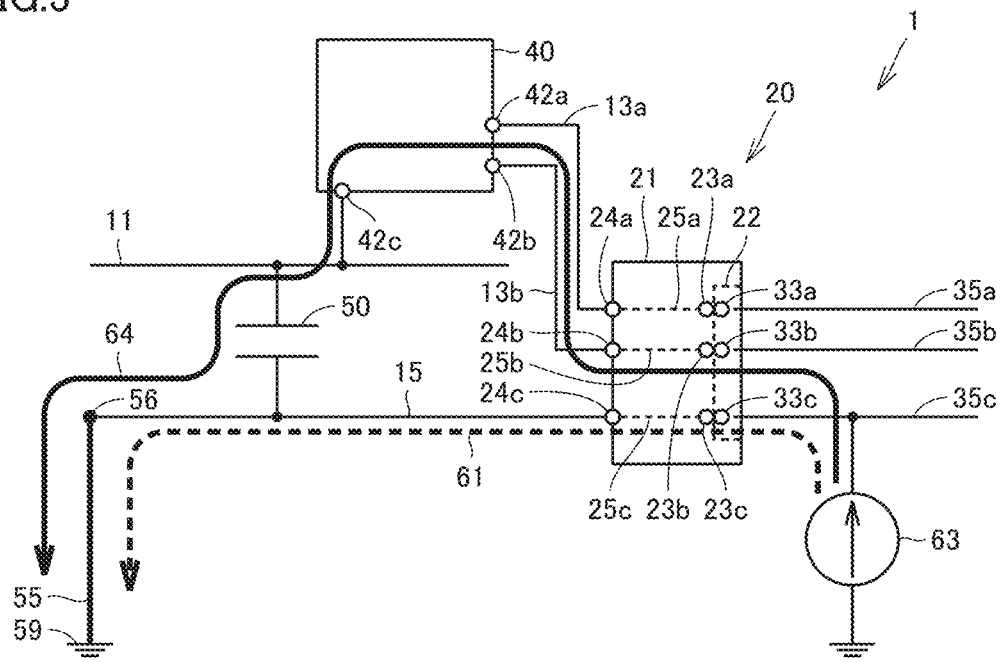
FIG. 3 is a circuit diagram of the printed circuit board in the first embodiment showing a path of electromagnetic noise.
Figure 4:
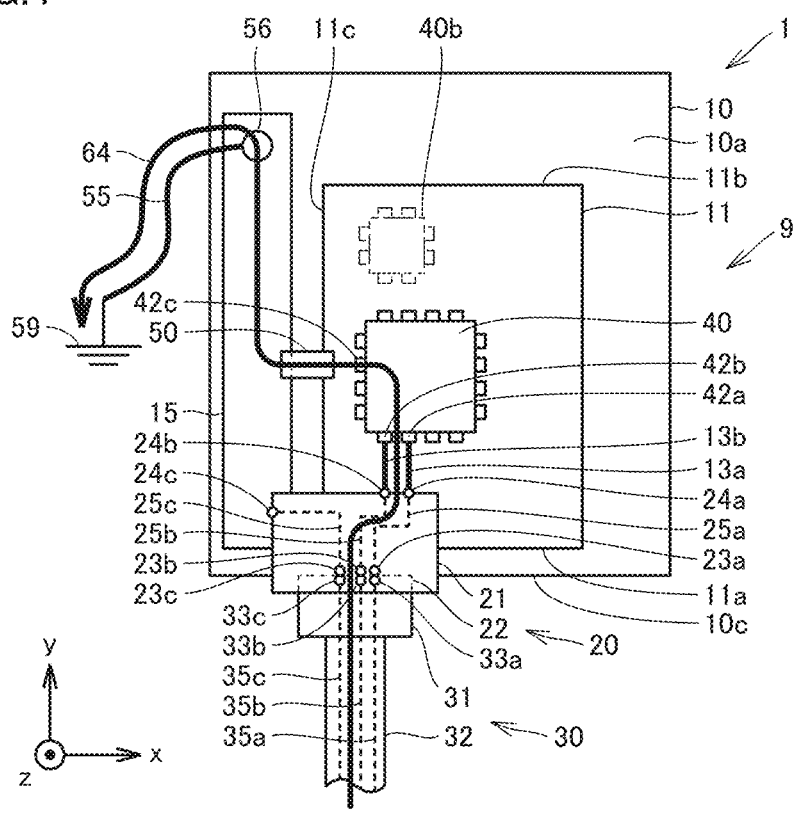
FIG. 4 is a schematic plan view of the printed circuit board in the first embodiment showing a path of electromagnetic noise.

Referring to FIG. 3 and FIG. 4, when electric cable 30 is connected to connector 20, second ground pattern 15 is electrically connected with sheath 32 of electric cable 30 through terminal 24c, chassis 21, and connector body 31, or electrically connected with cable ground wiring 35c of electric cable 30 through terminal 24c, connector ground wiring 25c, terminal 23c, and terminal 33c. For example, electromagnetic noise having a frequency of 1 MHz or higher may sometimes propagate from a noise source outside of printed circuit board 1 through electric cable 30 and flow into printed circuit board 1. Most of electromagnetic noise passes through chassis 21 or connector ground wiring 25c and terminal 24c and flows into second ground pattern 15 rather than flowing into first ground pattern 11 (see a noise path 61 in FIG. 3). In this way, most of electromagnetic noise can be released from second ground pattern 15 to the ground potential.

However, electric cable 30 has residual inductance. Thus, due to electrical crosstalk in electric cable 30, part of electromagnetic noise propagates through at least one first cable signal wiring (for example, first cable signal wiring 35a, 35b).

Electromagnetic noise passes through at least one first cable signal wiring, at least one first connector signal wiring (for example, first connector signal wiring 25a, 25b), and at least one first signal line pattern (for example, first signal line patterns 13a, 13b) and flows from at least one first signal terminal (for example, first signal terminals 42a, 42b) into first integrated circuit chip 40. Electromagnetic noise flows from first ground terminal 42c of first integrated circuit chip 40 into first ground pattern 11 (see a noise path 64 in FIG. 3 and FIG. 4).

In the present embodiment, second ground pattern 15 is directly opposed to first ground pattern 11 in a plan view of first main surface 10a of insulating substrate 10. First ground terminal 42c is electrically connected with first ground pattern 11 and opposed to second ground pattern 15 in a plan view of first main surface 10a of insulating substrate 10. Capacitor 50 is connected to first ground pattern 11 and second ground pattern 15 and disposed on straight line 50a that defines the shortest distance between first ground terminal 42c and second ground pattern 15 in a plan view of first main surface 10a of insulating substrate 10. Thus, electromagnetic noise flowing into first integrated circuit chip 40 does not spread to the entire first ground pattern 11 but flows into second ground pattern 15 through capacitor 50 (see noise path 64 in FIG. 3 and FIG. 4). Malfunction or electrical breakdown of an electronic component (for example, an active electronic component such as integrated circuit chip 40b or a light-emitting diode) other than first integrated circuit chip 40 electrically connected with first ground pattern 11 can be prevented.

Figure 5:
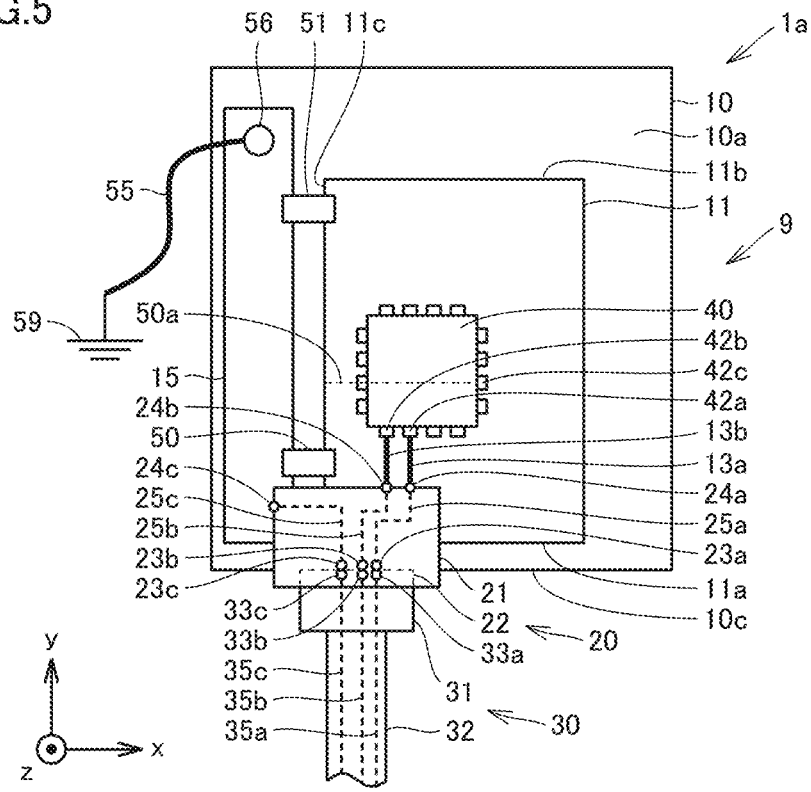
FIG. 5 is a schematic plan view of a printed circuit board in a comparative example.
Figure 6:
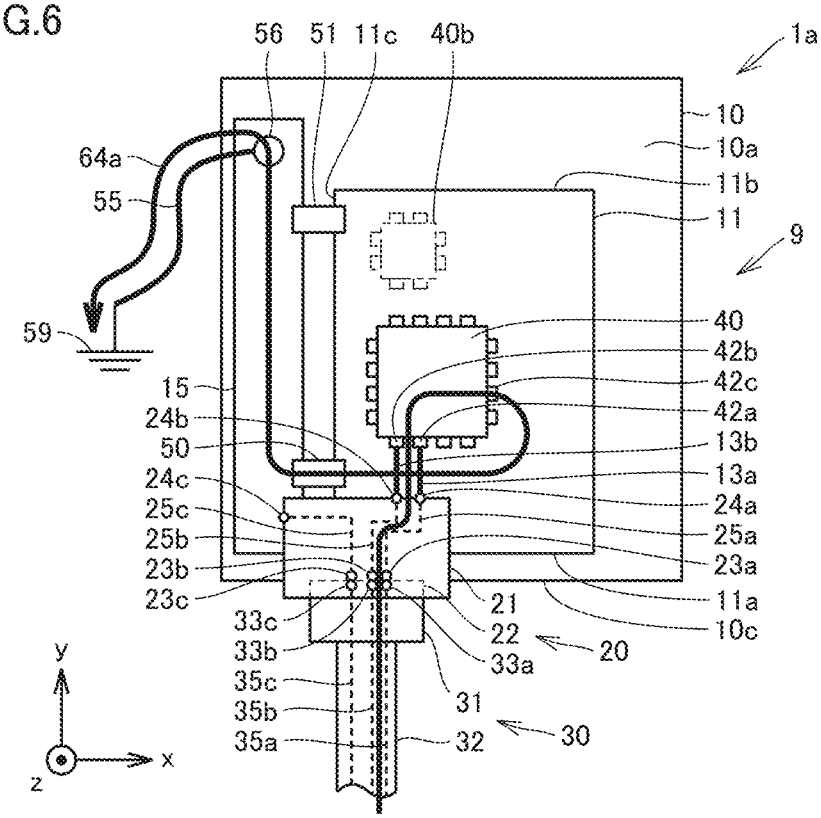
FIG. 6 is a schematic plan view of the printed circuit board in the comparative example showing a path of electromagnetic noise.
Figure 7:
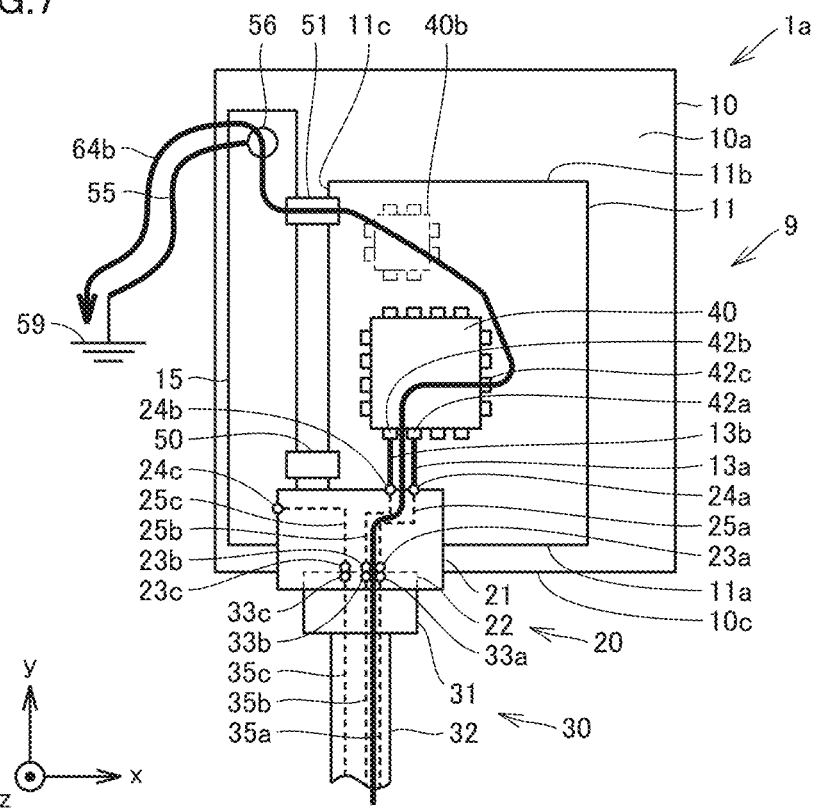
FIG. 7 is a schematic plan view of the printed circuit board in the comparative example showing a path of electromagnetic noise.

In comparison, referring to FIG. 5 to FIG. 7, in printed circuit board 1a in the comparative example, capacitor 51 is connected to first ground pattern 11 and second ground pattern 15 similarly to capacitor 50 of printed circuit board 1 in the present embodiment. Capacitor 51 is configured similarly to capacitor 50. However, in printed circuit board 1a in the comparative example, first ground terminal 42c is not opposed to second ground pattern 15 in a plan view of first main surface 10a of insulating substrate 10. In addition, capacitor 51 is disposed away from straight line 50a that defines the shortest distance between first ground terminal 42c and second ground pattern 15 in a plan view of first main surface 10a of insulating substrate 10. Moreover, as previously described, first ground pattern 11 has a smaller residual inductance than second ground pattern 15, and electromagnetic noise more easily flows to first ground pattern 11 than to second ground pattern 15.

Thus, electromagnetic noise flowing into first integrated circuit chip 40 spreads to the entire first ground pattern 11 (see noise paths 64a, 64b in FIG. 6 and FIG. 7). For example, as shown in FIG. 6, electromagnetic noise propagating from first ground terminal 42c of first integrated circuit chip 40 toward capacitor 50 crosses wiring such as at least one first signal line pattern (for example, first signal line patterns 13a, 13b) (see noise path 64a in FIG. 6). Part of electromagnetic noise flows into an electronic component (for example, first integrated circuit chip 40) connected to this wiring. As shown in FIG. 7, electromagnetic noise propagating from first ground terminal 42c of first integrated circuit chip 40 toward capacitor 51 propagates through an electronic component other than first integrated circuit chip 40 (for example, an active electronic component such as integrated circuit chip 40b or a light-emitting diode) (see noise path 64b in FIG. 7). In this way, the reference potential of an electronic component (first integrated circuit chip 40 and an electronic component other than first integrated circuit chip 40) connected to first ground pattern 11 is varied. Due to electromagnetic noise, an electronic component electrically connected with first ground pattern 11 (first integrated circuit chip 40 and an electronic component other than first integrated circuit chip 40) malfunctions or is electrically broken.

Figure 8:
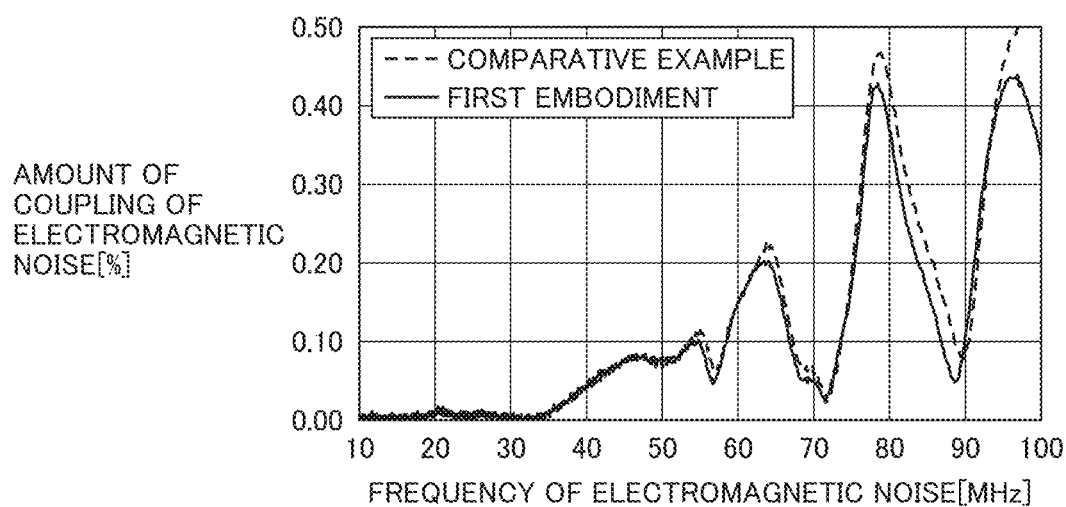
FIG. 8 is a graph showing the amount of coupling of electromagnetic noise to an integrated circuit chip in the first embodiment and the comparative example.

FIG. 8 shows the amount of coupling of electromagnetic noise to an electronic component other than first integrated circuit chip 40 (for example, integrated circuit chip 40b (see FIG. 4, FIG. 6, and FIG. 7)) in the present embodiment and the comparative example when electromagnetic noise is applied to electric cable 30. The amount of coupling of electromagnetic noise to integrated circuit chip 40b is measured by bringing a probe for electromagnetic noise detection into contact with a signal terminal and a ground terminal of integrated circuit chip 40b. It can be understood that the amount of coupling of electromagnetic noise to integrated circuit chip 40b (see FIG. 4) in the present embodiment is smaller than the amount of coupling of electromagnetic noise to integrated circuit chip 40b (see FIG. 6 and FIG. 7) in the comparative example.

Figure 9:
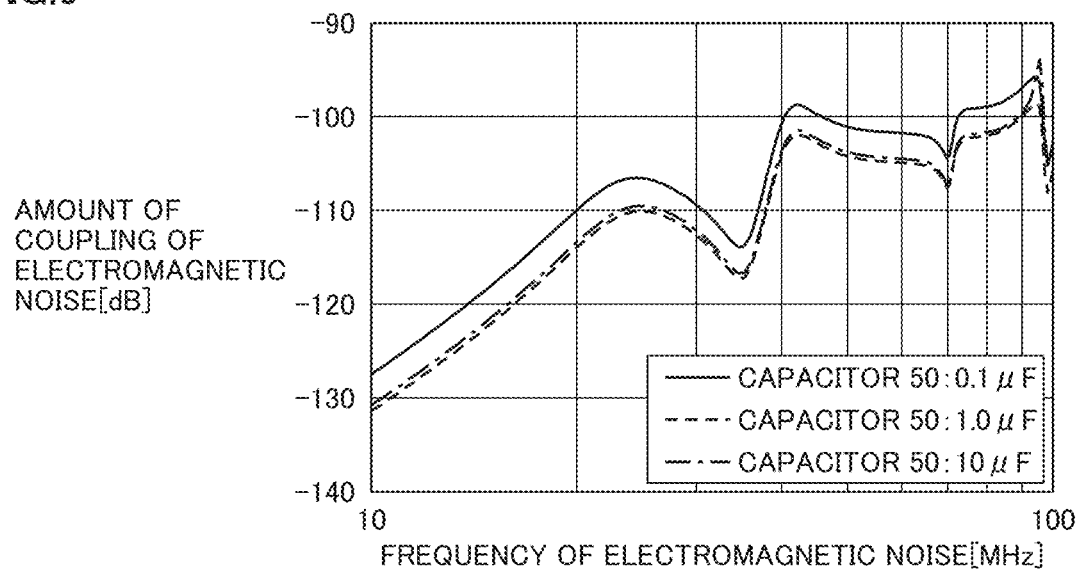
FIG. 9 is a graph showing the amount of coupling of electromagnetic noise to an integrated circuit chip with respect to the capacity of a capacitor in the first embodiment.

Referring to FIG. 9, it can be understood that in printed circuit board 1 in the present embodiment, when the capacity of capacitor 50 is increased from 0.1 μF to 1.0 μF, the amount of coupling of electromagnetic noise to an electronic component other than first integrated circuit chip 40 (for example, integrated circuit chip 40b (see FIG. 4)) is reduced. The reason is that the impedance of capacitor 50 decreases because of the increase of the capacity of capacitor 50, so that electromagnetic noise easily flows from first ground pattern 11 to second ground pattern 15 through capacitor 50. However, even when the capacity of capacitor 50 is increased from 1.0 μF to 10 μF, the amount of coupling of electromagnetic noise to integrated circuit chip 40b changes little. When capacitor 50 having a small capacity (for example, a capacity of 2.0 μF or less) is employed as capacitor 50, a capacitor having a high withstand voltage (for example, a withstand voltage of 500 V or higher) can be used as capacitor 50. Electromagnetic noise that can be released from first ground pattern 11 to second ground pattern 15 can be increased.

(Modifications)

Figure 10:
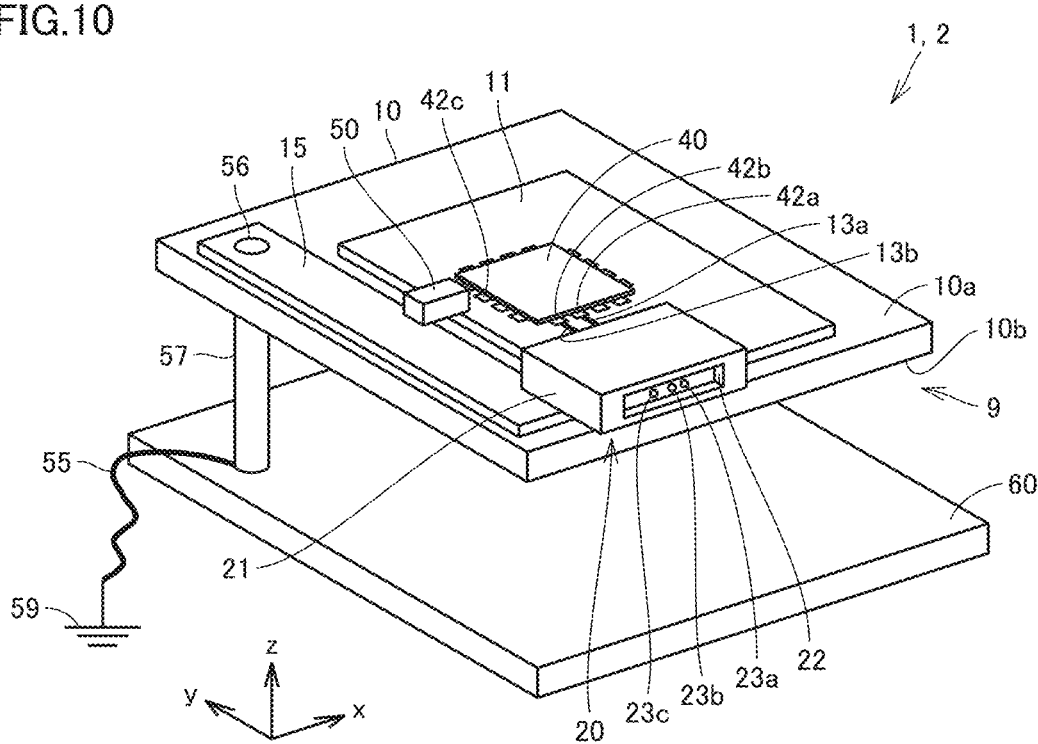
FIG. 10 is a perspective view of an electronic device in a modification of the first embodiment.

Referring to FIG. 10, in electronic device 2 in a first modification of the present embodiment, printed circuit board 1 separates from, for example, housing 60. Conductive wire 55 is connected to a conductive rod 57 such as a metal rod on a surface of housing 60. A first end of conductive rod 57 is fixed to housing 60. A second end of conductive rod 57 opposite the first end of conductive rod 57 is fitted in a hole provided in insulating substrate 10. Conductive rod 57 is fixed to second ground pattern 15 using fixing member 56 such as a screw. For example, the screw is threaded in a screw hole provided at the second end of conductive rod 57.

Figure 2:
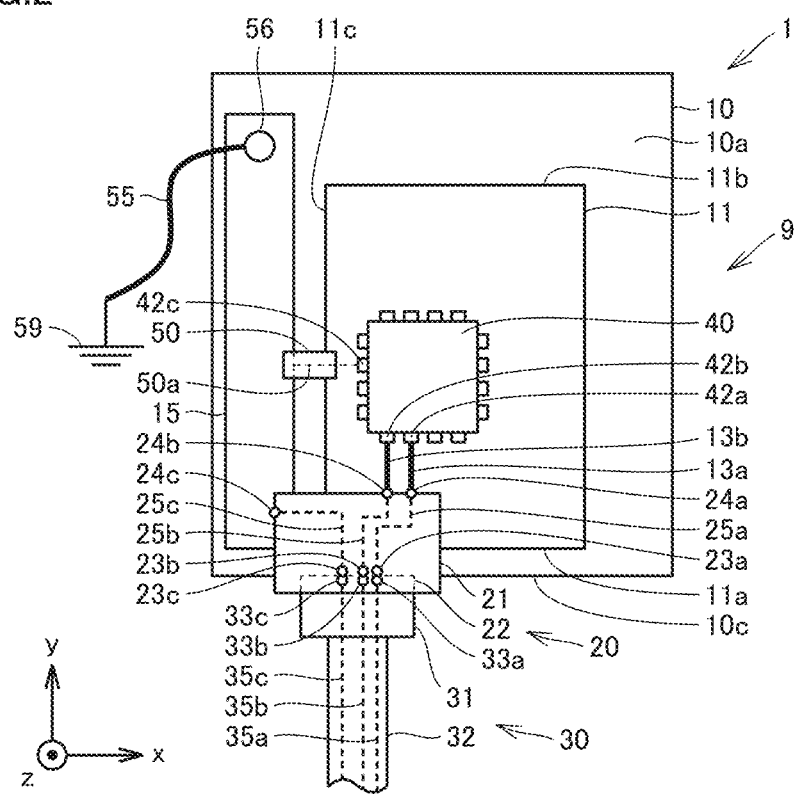
FIG. 2 is a schematic plan view of a printed circuit board in the first embodiment.

In the present embodiment shown in FIG. 1 and FIG. 2, printed board 9 is a single-sided printed board having first ground pattern 11, second ground pattern 15, and the first signal line pattern formed on first main surface 10a of insulating substrate 10. In a second modification of the present embodiment, printed board 9 may be a double-sided printed board or may be a multilayer printed board.

In a double-sided printed board, conductive patterns including first ground pattern 11, second ground pattern 15, and at least one first signal line pattern (for example, first signal line patterns 13a, 13b) are formed on both of first main surface 10a and second main surface 10b of insulating substrate 10.

In a multilayer printed board, conductive patterns including first ground pattern 11, second ground pattern 15, and at least one first signal line pattern (for example, first signal line patterns 13a, 13b) are formed on first main surface 10a and second main surface 10b of insulating substrate 10 and in the interior of insulating substrate 10. The conductive patterns formed in the interior of insulating substrate 10 are electrically connected to first integrated circuit chip 40 and an electronic component other than first integrated circuit chip 40 (for example, an active electronic component such as integrated circuit chip 40b or a light-emitting diode), using conductive vias (not shown) extending in the thickness direction (third direction (z direction)) of insulating substrate 10. When first ground pattern 11 is formed in the interior of insulating substrate 10, first integrated circuit chip 40 and an electronic component other than first integrated circuit chip 40 are disposed above first ground pattern 11 in a plan view of first main surface 10a of insulating substrate 10.

In a third modification of the present embodiment, first integrated circuit chip 40 may be a power supply IC chip, and at least one first signal line pattern (for example, first signal line patterns 13a, 13b) may be power supply wiring.

In a fourth modification of the present embodiment, reference potential 59 may be a potential of a conductor serving as a reference potential of electronic device 2 (for example, a potential of the negative electrode of a battery when housing 60 is floated from the potential of the earth, as in an automobile, aircraft, or artificial satellite), instead of the potential of the ground.

The effect of printed circuit board 1 in the present embodiment will be described.

Printed circuit board 1 in the present embodiment includes printed board 9, first integrated circuit chip 40, connector 20, and a first capacitor (for example, capacitor 50). Printed board 9 includes insulating substrate 10 including first main surface 10a, first ground pattern 11, second ground pattern 15, and a first signal line pattern (for example, first signal line patterns 13a, 13b). First integrated circuit chip 40 is mounted on printed board 9. Connector 20 is mounted on printed board 9 and connectable to electric cable 30. The first capacitor is mounted on printed board 9. In a plan view of first main surface 10a of insulating substrate 10, first ground pattern 11 has a wider area than second ground pattern 15. Second ground pattern 15 separates from first ground pattern 11 and is directly opposed to first ground pattern 11 in a plan view of first main surface 10a of insulating substrate 10. The first signal line pattern is insulated from first ground pattern 11 and second ground pattern 15. Connector 20 includes chassis 21, connector ground wiring 25c provided inside chassis 21, and first connector signal wiring (for example, first connector signal wiring 25a, 25b) provided inside chassis 21. First integrated circuit chip 40 includes first ground terminal 42c and a first signal terminal (for example, first signal terminals 42a, 42b). First ground terminal 42c is electrically connected with first ground pattern 11 and opposed to second ground pattern 15 in a plan view of first main surface 10a of insulating substrate 10. The first signal terminal is electrically connected with the first connector signal wiring through the first signal line pattern. Second ground pattern 15 is electrically connected with chassis 21 or connector ground wiring 25c. The first capacitor is connected to first ground pattern 11 and second ground pattern 15 and disposed on straight line 50a that defines the shortest distance between first ground terminal 42c and second ground pattern 15 in a plan view of first main surface 10a of insulating substrate 10.

Thus, electromagnetic noise from electric cable 30 into first integrated circuit chip 40 does not spread to the entire first ground pattern 11 but flows into the second ground pattern 15 through the first capacitor (for example, capacitor 50). Malfunction or electrical breakdown of an electronic component electrically connected with first ground pattern 11 (first integrated circuit chip 40 and an electronic component other than first integrated circuit chip 40 (for example, an active electronic component such as integrated circuit chip 40b or a light-emitting diode) can be prevented.

In printed circuit board 1 in the present embodiment, the shortest distance between first ground terminal 42c and second ground pattern 15 is one-tenth or less of the electrical length inside printed board 9 of electromagnetic noise from connector 20.

Thus, electromagnetic noise from electric cable 30 into first integrated circuit chip 40 does not spread to the entire first ground pattern 11 but flows into the second ground pattern 15 through the first capacitor (for example, capacitor 50). Malfunction or electrical breakdown of an electronic component electrically connected with first ground pattern 11 (for example, first integrated circuit chip 40 and an electronic component other than first integrated circuit chip 40 (for example, an active electronic component such as integrated circuit chip 40b or a light-emitting diode) can be prevented.

In printed circuit board 1 in the present embodiment, the first capacitor (for example, capacitor 50) is the only capacitor that is connected to first ground pattern 11 and second ground pattern 15.

Thus, electromagnetic noise into second ground pattern 15 through the first capacitor (for example, capacitor 50) can be prevented from returning to first ground pattern 11 through another capacitor. Malfunction or electrical breakdown of an electronic component electrically connected with first ground pattern 11 (first integrated circuit chip 40 and an electronic component other than first integrated circuit chip 40 (for example, an active electronic component such as integrated circuit chip 40b or a light-emitting diode) can be prevented.

In printed circuit board 1 in the present embodiment, in a plan view of first main surface 10a of insulating substrate 10, printed board 9 has a rectangular shape. The size of each side of printed board 9 in a plan view of first main surface 10a of insulating substrate 10 is 5 cm or more and 15 cm or less. The capacity of the first capacitor (for example, capacitor 50) is 0.5 µF or more and 5.0 µF or less.

The capacity of the first capacitor (for example, capacitor 50) is 0.5 µF or more. Thus, an excessive increase of the impedance of the first capacitor for high-frequency electromagnetic noise (for example, electromagnetic noise having a frequency of 1 MHz or higher) from a typical electronic device is prevented. The high-frequency electromagnetic noise from electric cable 30 into first ground pattern 11 easily flows from first ground pattern 11 to second ground pattern 15 through the first capacitor. The first capacitor having a capacity of 0.5 µF or more can prevent the high-frequency electromagnetic noise into first ground pattern 11 from spreading to the entire first ground pattern 11 and enables the high-frequency electromagnetic noise to escape to the outside of printed circuit board 1 (for example, reference potential 59) via the first capacitor and second ground pattern 15. Variation in potential of the first ground pattern 11 resulting from high-frequency electromagnetic noise is suppressed, and malfunction or electrical breakdown of an electronic component electrically connected with first ground pattern 11 (for example, first integrated circuit chip 40 and an electronic component other than first integrated circuit chip 40 (for example, an active electronic component such as integrated circuit chip 40b or a light-emitting diode) can be prevented.

The capacity of the first capacitor (for example, capacitor 50) is 5.0 µF or less. Thus, excessive decrease of the impedance of the first capacitor for low-frequency electromagnetic noise (for example, electromagnetic noise having a frequency of 100 kHz or lower) resulting from lightning or the like is prevented. Capacitor 50 having a capacity of 5.0 µF or less prevents the low-frequency electromagnetic noise propagating through electric cable 30 from flowing from second ground pattern 15 into first ground pattern 11 through the first capacitor and enables the low-frequency electromagnetic noise to escape to the outside of printed circuit board 1 (for example, reference potential 59). Variation in potential of the first ground pattern 11 resulting from low-frequency electromagnetic noise is suppressed, and malfunction or electrical breakdown of an electronic component electrically connected with first ground pattern 11 (first integrated circuit chip 40 and an electronic component other than first integrated circuit chip 40 (for example, an active electronic component such as integrated circuit chip 40b or a light-emitting diode) can be prevented.

Further, since the capacity of the first capacitor (for example capacitor 50) is 5.0 µF or less, a capacitor having a high withstand voltage (for example, a withstand voltage of 500 V or higher) can be used as the first capacitor. Electromagnetic noise that can be released from first ground pattern 11 to second ground pattern 15 can be increased. Malfunction or electrical breakdown of an electronic component electrically connected with first ground pattern 11 (first integrated circuit chip 40 and an electronic component other than first integrated circuit chip 40 (for example, an active electronic component such as integrated circuit chip 40b or a light-emitting diode) can be prevented.

Second Embodiment

Figure 11:
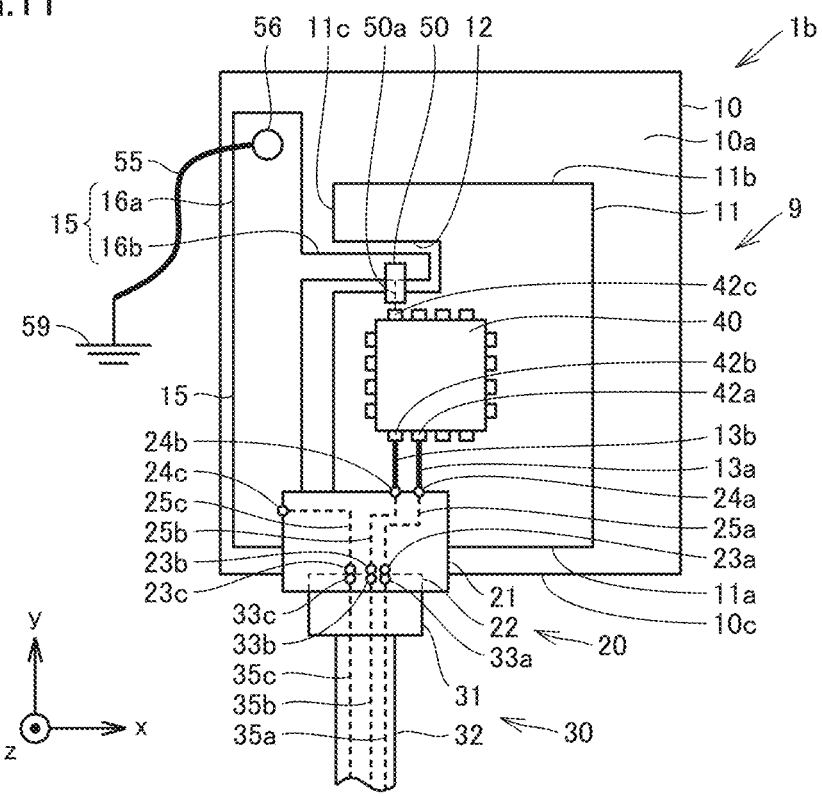
FIG. 11 is a schematic plan view of a printed circuit board in a second embodiment.

Referring to FIG. 11, a printed circuit board 1b in a second embodiment will be described. Printed circuit board 1b in the present embodiment has a configuration similar to printed circuit board 1 in the first embodiment but differs mainly in the following points.

First ground pattern 11 in the present embodiment has a recess 12 receiving the second ground pattern. Specifically, recess 12 is provided at the outer edge portion 11c of first ground pattern 11.

In the present embodiment, second ground pattern 15 includes a first ground pattern portion 16a and a second ground pattern portion 16b.

First ground pattern portion 16a extends along the outer edge portion 11c of first ground pattern 11. First ground pattern portion 16a extends, for example, along the second direction (y direction). First ground pattern portion 16a may have, for example, a stripe shape. The lengthwise direction of first ground pattern portion 16a is, for example, the second direction (y direction). The widthwise direction of first ground pattern portion 16a is, for example, the first direction (x direction).

First ground pattern portion 16a separates from first ground pattern 11 (outer edge portion 11c). Specifically, first ground pattern portion 16a separates from first ground pattern 11 (outer edge portion 11c) in the first direction (x direction). First ground pattern portion 16a is directly opposed to first ground pattern 11 (outer edge portion 11c) in a plan view of first main surface 10a of insulating substrate 10. In other words, in a plan view of first main surface 10a of insulating substrate 10, printed board 9 does not include a conductive pattern (excluding second ground pattern portion 16b) between first ground pattern 11 (outer edge portion 11c) and first ground pattern portion 16a.

The conductor (for example, conductive wire 55) is fixed to first ground pattern portion 16a, using fixing member 56 such as a screw, at a distal end of first ground pattern portion 16a relative to outer edge portion 11a of first ground pattern 11 (outer edge portion 10c of insulating substrate 10) (a proximal end of first ground pattern portion 16a relative to outer edge portion 11b of first ground pattern 11).

Second ground pattern portion 16b is connected to first ground pattern portion 16a in an intermediate region of first ground pattern portion 16a excluding both ends of first ground pattern portion 16a in the lengthwise direction of first ground pattern portion 16a. Second ground pattern portion 16b protrudes from first ground pattern portion 16a toward first ground pattern 11. The direction of protrusion of second ground pattern portion 16b from first ground pattern portion 16a is, for example, the first direction (x direction).

Second ground pattern portion 16b separates from first ground pattern 11. Second ground pattern portion 16b is directly opposed to first ground pattern 11 in a plan view of first main surface 10a of insulating substrate 10. In other words, in a plan view of first main surface 10a of insulating substrate 10, printed board 9 does not include a conductive pattern between first ground pattern 11 and second ground pattern portion 16b. Second ground pattern portion 16b extends inside recess 12 of first ground pattern 11.

First integrated circuit chip 40 in the present embodiment is similar to first integrated circuit chip 40 in the first embodiment but differs from first integrated circuit chip 40 in the first embodiment in the following points. In the present embodiment, first ground terminal 42c is opposed to second ground pattern portion 16b in the second direction (y direction).

Capacitor 50 is connected to first ground pattern 11 and second ground pattern portion 16b. In a plan view of first main surface 10a of insulating substrate 10, capacitor 50 is disposed on straight line 50a that defines the shortest distance between first ground terminal 42c and second ground pattern portion 16b. Straight line 50a may extend in a direction different from the direction of protrusion (for example, first direction (x direction)) of second ground pattern portion 16b from first ground pattern portion 16a. For example, straight line 50a may extend along the second direction (y direction).

Printed circuit board 1b in the present embodiment achieves the following effects similar to the effects of printed circuit board 1 in the first embodiment.

In printed circuit board 1b in the present embodiment, second ground pattern 15 includes first ground pattern portion 16a and second ground pattern portion 16b. Second ground pattern portion 16b protrudes from first ground pattern portion 16a toward first ground pattern 11. First ground pattern 11 has recess 12 receiving second ground pattern portion 16b. In a plan view of first main surface 10a of insulating substrate 10, first ground terminal 42c is opposed to second ground pattern portion 16b. The first capacitor (capacitor 50) is connected to first ground pattern 11 and second ground pattern portion 16b and disposed on straight line 50a that defines the shortest distance between first ground terminal 42c and second ground pattern portion 16b in a plan view of first main surface 10a of insulating substrate 10.

Thus, electromagnetic noise from electric cable 30 into first integrated circuit chip 40 does not spread to the entire first ground pattern 11 but flows into second ground pattern 15 through the first capacitor (capacitor 50), without changing the orientation of first integrated circuit chip 40. Malfunction or electrical breakdown of an electronic component electrically connected with first ground pattern 11 (first integrated circuit chip 40 and an electronic component other than first integrated circuit chip 40 (for example, an active electronic component such as integrated circuit chip 40b (see FIG. 4) or a light-emitting diode) can be prevented.

Third Embodiment

Figure 12:
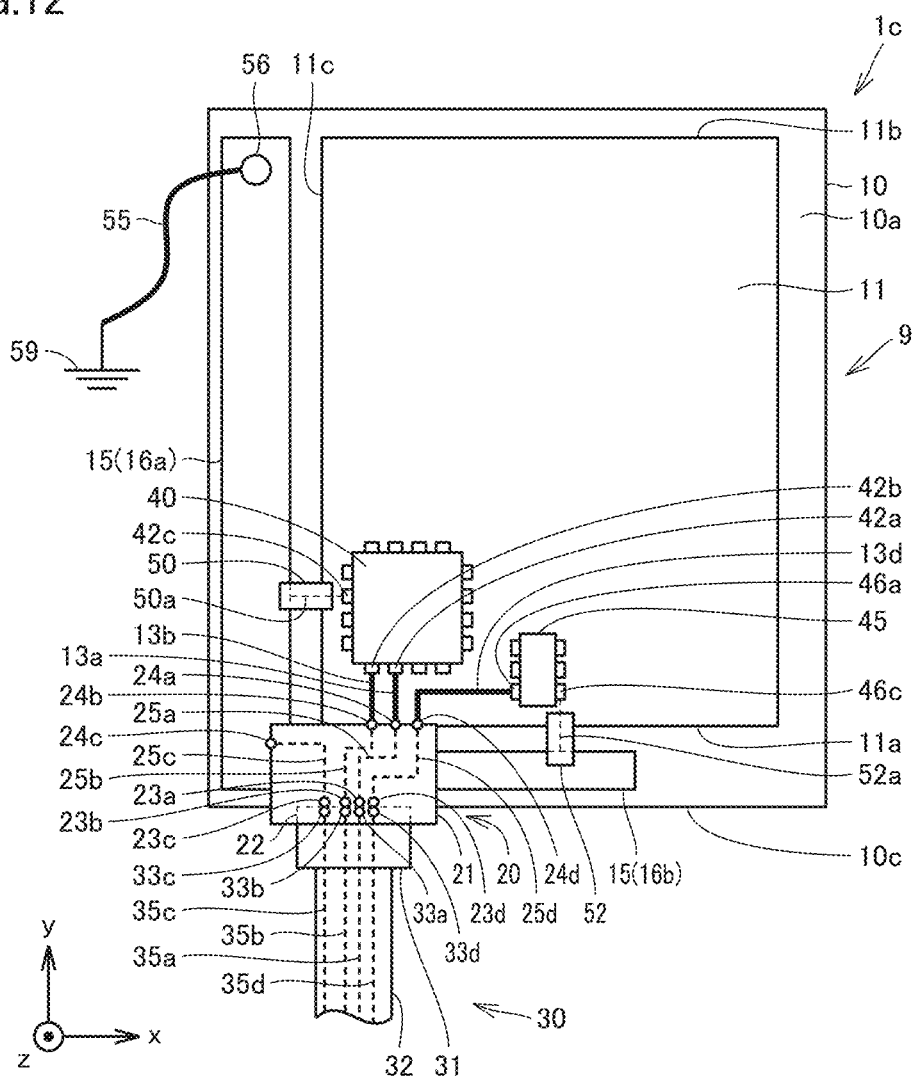
FIG. 12 is a schematic plan view of a printed circuit board in a third embodiment.

Referring to FIG. 12, a printed circuit board 1c in a third embodiment will be described. Printed circuit board 1c in the present embodiment has a configuration similar to printed circuit board 1 in the first embodiment but differs mainly in the following points.

In the present embodiment, second ground pattern 15 includes a first ground pattern portion 16a and a second ground pattern portion 16b.

First ground pattern portion 16a in the present embodiment is similar to first ground pattern portion 16a in the second embodiment.

Second ground pattern portion 16b in the present embodiment is similar to second ground pattern portion 16b in the second embodiment but differs from second ground pattern portion 16b in the second embodiment in the following points.

Second ground pattern portion 16b extends along outer edge portion 11a of first ground pattern 11. Second ground pattern portion 16b extends, for example, along the first direction (x direction). Second ground pattern portion 16b may have, for example, a stripe shape. The lengthwise direction of second ground pattern portion 16b is, for example, the first direction (x direction). The widthwise direction of second ground pattern portion 16b is, for example, the second direction (y direction). Second ground pattern portion 16b is connected to first ground pattern portion 16a at a proximal end of first ground pattern portion 16a relative to outer edge portion 11a of first ground pattern 11 (outer edge portion 10c of insulating substrate 10). In a plan view of first main surface 10a of insulating substrate 10, second ground pattern 15 has, for example, a shape of the letter L.

Second ground pattern portion 16b separates from first ground pattern 11 (outer edge portion 11a). Specifically, second ground pattern portion 16b separates from first ground pattern 11 (outer edge portion 11a) in the second direction (y direction). Second ground pattern portion 16b is directly opposed to first ground pattern 11 (outer edge portion 11a) in a plan view of first main surface 10a of insulating substrate 10. In other words, in a plan view of first main surface 10a of insulating substrate 10, printed board 9 does not include a conductive pattern between first ground pattern 11 (outer edge portion 11a) and second ground pattern portion 16b.

Printed board 9 further includes a second signal line pattern 13d. Second signal line pattern 13d is formed of, for example, a conductive material such as copper or aluminum. Second signal line pattern 13d is provided, for example, on first main surface 10a. Second signal line pattern 13d may be formed in the interior of insulating substrate 10. Second signal line pattern 13d separates from first ground pattern 11 and second ground pattern 15 and is insulated from first ground pattern 11 and second ground pattern 15. Second signal line pattern 13d corresponds to second cable signal wiring 35d.

Connector 20 further includes second connector signal wiring 25d and terminals 23d, 24d. Second connector signal wiring 25d is provided inside chassis 21. Second connector signal wiring 25d corresponds to second cable signal wiring 35d. Second connector signal wiring 25d is connected to terminal 23d and terminal 24d. Terminal 24d is in contact with second signal line pattern 13d and electrically connected with second signal line pattern 13d.

Electric cable 30 further includes second cable signal wiring 35d and a terminal 33d. Sheath 32 further accommodates second cable signal wiring 35d. Second cable signal wiring 35d is connected to terminal 33d. When electric cable 30 is connected to connector 20, terminal 33d comes into contact with terminal 23d. In this way, second cable signal wiring 35d is electrically connected with second connector signal wiring 25d through terminal 33d and terminal 23d.

First ground terminal 42c of first integrated circuit chip 40 is opposed to first ground pattern portion 16a in a plan view of first main surface 10a of insulating substrate 10.

Capacitor 50 is connected to first ground pattern 11 and first ground pattern portion 16a. Capacitor 50 may be the only capacitor that is connected to first ground pattern 11 and first ground pattern portion 16a. In a plan view of first main surface 10a of insulating substrate 10, capacitor 50 is disposed on straight line 50a that defines the shortest distance between first ground terminal 42c and first ground pattern portion 16a. Straight line 50a extends, for example, along the first direction (x direction).

Printed circuit board 1c further includes a second integrated circuit chip 45 and a capacitor 52.

Second integrated circuit chip 45 is, for example, but not limited to, an application-specific integrated circuit (ASIC) chip including a communication circuit, or a power supply IC chip. Second integrated circuit chip 45 is mounted on printed board 9. Second integrated circuit chip 45 is disposed on first ground pattern 11. In a plan view of first main surface 10a of insulating substrate 10, first integrated circuit chip 40 is disposed inside the outer edge of first ground pattern 11. Second integrated circuit chip 45 includes a second ground terminal 46c and a second signal terminal 46a.

Second signal terminal 46a corresponds to second signal line pattern 13d. Second signal terminal 46a is in contact with second signal line pattern 13d and electrically connected with second signal line pattern 13d. Second signal terminal 46a is electrically connected with second connector signal wiring 25d through second signal line pattern 13d. Specifically, second signal terminal 46a is electrically connected with second connector signal wiring 25d through second signal line pattern 13d and terminal 24d.

Second ground terminal 46c is in contact with first ground pattern 11 and electrically connected with first ground pattern 11. Second ground terminal 46c is opposed to second ground pattern 15 in a plan view of first main surface 10a of insulating substrate 10. In particular, second ground terminal 46c is opposed to second ground pattern portion 16b in a plan view of first main surface 10a of insulating substrate 10. The shortest distance between second ground terminal 46c and second ground pattern 15 (second ground pattern portion 16b) is, for example, one-tenth or less of the electrical length inside printed board 9 of electromagnetic noise (for example, common-mode noise) from connector 20. The shortest distance between second ground terminal 46c and second ground pattern 15 (second ground pattern portion 16b) may be one-twentieth or less of the electrical length, one-fiftieth or less of the electrical length, or one-hundredth or less of the electrical length.

Capacitor 52 is, for example, a multilayer ceramic capacitor or an aluminum electrolytic capacitor. Capacitor 52 is mounted on printed board 9. Capacitor 52 is connected to first ground pattern 11 and second ground pattern 15 (second ground pattern portion 16b). Capacitor 52 may be the only capacitor that is connected to first ground pattern 11 and second ground pattern portion 16b.

The capacity of capacitor 52 is, for example, 0.5 µF or more. The capacity of capacitor 52 may be, for example, 0.9 µF or more.

Thus, excessive increase of the impedance of capacitor 52 for high-frequency electromagnetic noise (for example, electromagnetic noise having a frequency of 1 MHz or higher) from a typical electronic device is prevented. The high-frequency electromagnetic noise from electric cable 30 into first ground pattern 11 easily flows from first ground pattern 11 to second ground pattern 15 (second ground pattern portion 16b) through capacitor 52. Variation in potential of the first ground pattern 11 resulting from high-frequency electromagnetic noise is suppressed, and malfunction or electrical breakdown of an electronic component electrically connected with first ground pattern 11 (first integrated circuit chip 40 and an electronic component other than first integrated circuit chip 40 (for example, an active electronic component such as integrated circuit chip 40b (see FIG. 4) or a light-emitting diode) can be prevented.

The capacity of capacitor 52 is, for example, 5.0 µF or less. The capacity of capacitor 52 may be, for example, 2.0 µF or less or may be 1.1 µF or less.

Thus, excessive decrease of the impedance of capacitor 52 for low-frequency electromagnetic noise (for example, electromagnetic noise with 100 kHz or lower) resulting from lightning or the like is prevented. Capacitor 52 having a capacity of 5.0 µF or less prevents the low-frequency electromagnetic noise propagating through electric cable 30 from flowing from second ground pattern 15 (second ground pattern portion 16b) into first ground pattern 11 through capacitor 52 and enables the low-frequency electromagnetic noise to escape to the outside of printed circuit board 1 (for example, reference potential 59). Variation in potential of first ground pattern 11 resulting from low-frequency electromagnetic noise is suppressed, and malfunction or electrical breakdown of an electronic component electrically connected with first ground pattern 11 (first integrated circuit chip 40 and an electronic component other than first integrated circuit chip 40 (for example, an active electronic component such as integrated circuit chip 40b (see FIG. 4) or a light-emitting diode) can be prevented.

Further, since the capacity of capacitor 52 is 5.0 µF or less, a capacitor having a high withstand voltage (for example, a withstand voltage of 500 V or higher) can be used as capacitor 52. Electromagnetic noise flowing from first ground pattern 11 to second ground pattern 15 (second ground pattern portion 16b) can be increased.

In a plan view of first main surface 10a of insulating substrate 10, capacitor 52 is disposed on a straight line 52a that defines the shortest distance between second ground terminal 46c and second ground pattern 15 (second ground pattern portion 16b). Straight line 52a may extend in a direction different from straight line 50a. Straight line 52a extends, for example, along the second direction (y direction).

Printed circuit board 1c in the present embodiment achieves the following effects in addition to the effects of printed circuit board 1 in the first embodiment.

Printed circuit board 1c in the present embodiment further includes second integrated circuit chip 45 and a second capacitor (for example, capacitor 52). Printed board 9 further includes second signal line pattern 13d. Connector 20 further includes second connector signal wiring 25d provided inside chassis 21. Second integrated circuit chip 45 is placed on printed board 9. Second integrated circuit chip 45 includes second ground terminal 46c and second signal terminal 46a. Second signal terminal 46a is electrically connected with second connector signal wiring 25d through second signal line pattern 13d. Second ground terminal 46c is electrically connected with first ground pattern 11 and opposed to second ground pattern 15 in a plan view of first main surface 10a of insulating substrate 10. The second capacitor is mounted on printed board 9. The second capacitor is connected to first ground pattern 11 and second ground pattern 15 and disposed on straight line 52a that defines the shortest distance between second ground terminal 46c and second ground pattern 15 in a plan view of first main surface 10a of insulating substrate 10.

Thus, electromagnetic noise from electric cable 30 into second integrated circuit chip 45 does not spread to the entire first ground pattern 11 but flows into second ground pattern 15 through the second capacitor (for example, capacitor 52). Malfunction or electrical breakdown of an electronic component electrically connected with first ground pattern 11 (first integrated circuit chip 40, second integrated circuit chip 45, and an electronic component other than first integrated circuit chip 40 and second integrated circuit chip 45 (for example, an active electronic component such as integrated circuit chip 40b (see FIG. 4) or a light-emitting diode) can be prevented.

In printed circuit board 1c in the present embodiment, in a plan view of first main surface 10a of insulating substrate 10, first ground pattern 11 includes a first outer edge portion (outer edge portion 11a) and a second outer edge portion (outer edge portion 11c). The second outer edge portion is connected to the first outer edge portion and extends in a direction different from the first outer edge portion. Second ground pattern 15 includes first ground pattern portion 16a and second ground pattern portion 16b. First ground pattern portion 16a extends along the second outer edge portion. Second ground pattern portion 16b extends along the first outer edge portion and is connected to first ground pattern portion 16a. The first capacitor (for example, capacitor 50) is connected to first ground pattern 11 and first ground pattern portion 16a and disposed on straight line 50a that defines the shortest distance between first ground terminal 42c and first ground pattern portion 16a in a plan view of first main surface 10a of insulating substrate 10. The second capacitor (for example, capacitor 52) is connected to first ground pattern 11 and second ground pattern portion 16b and disposed on straight line 52a that defines the shortest distance between second ground terminal 46c and second ground pattern portion 16b in a plan view of first main surface 10a of insulating substrate 10.

Thus, electromagnetic noise from electric cable 30 into first integrated circuit chip 40 and second integrated circuit chip 45 does not spread to the entire first ground pattern 11 but flows into second ground pattern 15 through the first capacitor (for example, capacitor 50) and the second capacitor (for example, capacitor 52). Malfunction or electrical breakdown of an electronic component electrically connected with first ground pattern 11 (first integrated circuit chip 40, second integrated circuit chip 45, and an electronic component other than first integrated circuit chip 40 and second integrated circuit chip 45 (for example, an active electronic component such as integrated circuit chip 40b (see FIG. 4) or a light-emitting diode) can be prevented.

Fourth Embodiment

Figure 13:
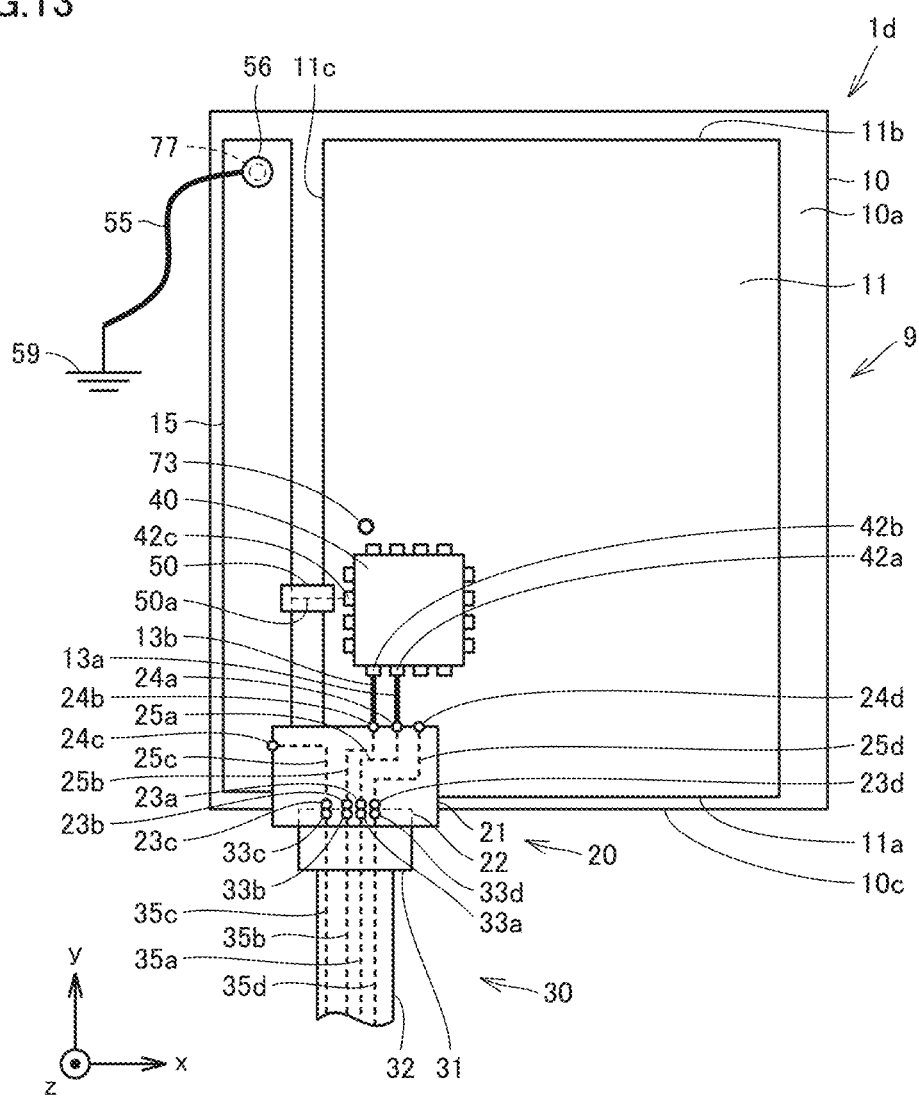
FIG. 13 is a schematic plan view of a printed circuit board in a fourth embodiment.
Figure 14:
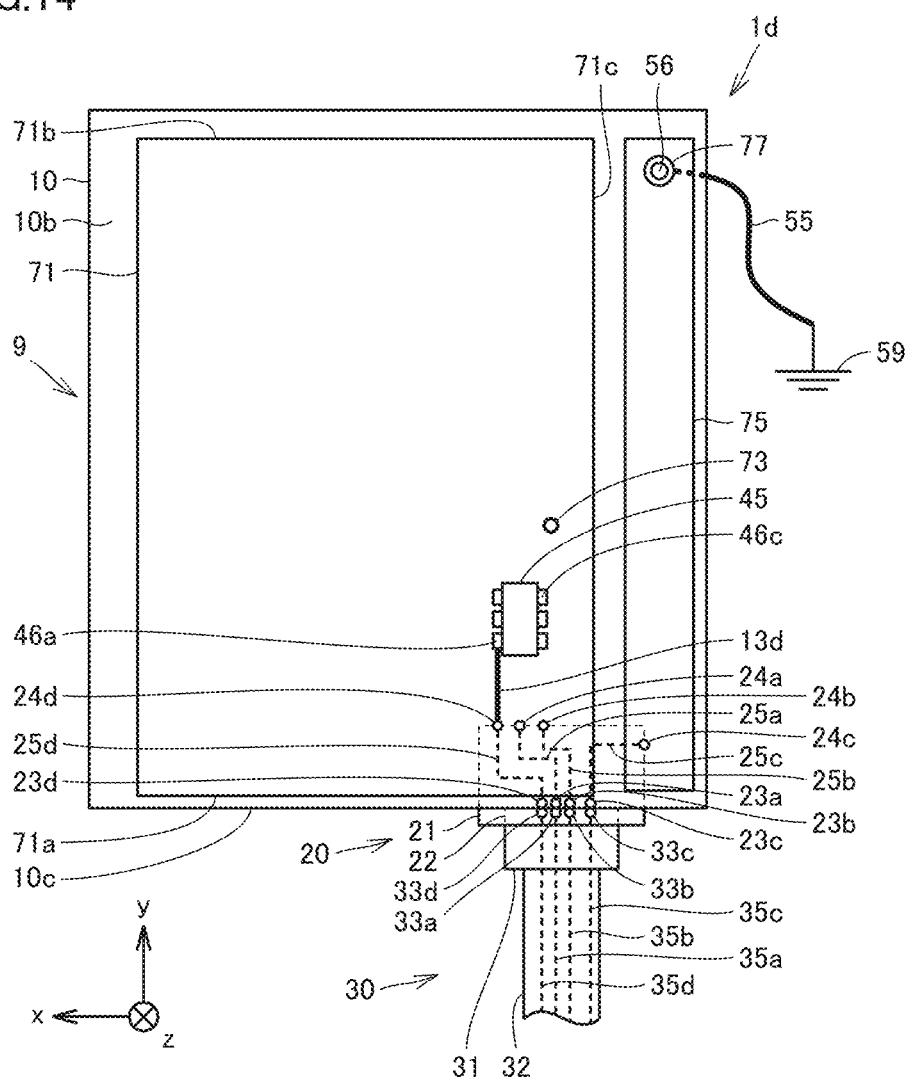
FIG. 14 is a schematic bottom view of the printed circuit board in the fourth embodiment.

Referring to FIG. 13 and FIG. 14, a printed circuit board 1d in a fourth embodiment will be described. Printed circuit board 1d in the present embodiment has a configuration similar to printed circuit board 1 in the first embodiment but differs mainly in the following points.

In the present embodiment, printed board 9 is, for example, a double-sided printed board. Specifically, printed board 9 further includes a third ground pattern 71, a fourth ground pattern 75, a second signal line pattern 13d, at least one first conductive via 73, and a second conductive via 77.

Third ground pattern 71 is formed of, for example, a conductive material such as copper or aluminum. Third ground pattern 71 is electrically connected with second ground terminal 46c of second integrated circuit chip 45 and provides a reference potential to second integrated circuit chip 45. Third ground pattern 71 is provided, for example, on second main surface 10b. In a plan view of first main surface 10a (second main surface 10b) of insulating substrate 10, third ground pattern 71 overlaps first ground pattern 11. In particular, in a plan view of first main surface 10a (second main surface 10b) of insulating substrate 10, third ground pattern 71 may completely overlap first ground pattern 11. In a plan view of second main surface 10b of insulating substrate 10, third ground pattern 71 is disposed at the center of insulating substrate 10 relative to fourth ground pattern 75.

In a plan view of second main surface 10b of insulating substrate 10, third ground pattern 71 has a wider area than fourth ground pattern 75. In other words, in a plan view of first main surface 10a of insulating substrate 10, third ground pattern 71 has a larger width than fourth ground pattern 75. Third ground pattern 71 has a larger cross-sectional area than fourth ground pattern 75. Thus, third ground pattern 71 has a smaller residual inductance than fourth ground pattern 75. The cross-sectional area of third ground pattern 71 means, for example, the area of third ground pattern 71 in a cross section perpendicular to first main surface 10a of insulating substrate 10 and the lengthwise direction of third ground pattern 71. The cross-sectional area of fourth ground pattern 75 means, for example, the area of fourth ground pattern 75 in a cross section perpendicular to first main surface 10a of insulating substrate 10 and the lengthwise direction of fourth ground pattern 75.

In a plan view of first main surface 10a of insulating substrate 10, third ground pattern 71 includes an outer edge portion 71a, an outer edge portion 71b opposite outer edge portion 71a, and an outer edge portion 71c. Outer edge portion 71a is opposed to outer edge portion 10c of insulating substrate 10. Outer edge portion 71a is, for example, a portion nearest to outer edge portion 10c of insulating substrate 10, in the outer edge of third ground pattern 71. Outer edge portion 71b is, for example, a portion farthest from outer edge portion 10c of insulating substrate 10, in the outer edge of third ground pattern 71. Outer edge portion 71a and outer edge portion 71b extend, for example, along the first direction (x direction). Outer edge portion 71c is connected to outer edge portion 71a and outer edge portion 71b. Outer edge portion 71c extends in a direction different from outer edge portion 71a and outer edge portion 71b. Outer edge portion 71c extends, for example, along the second direction (y direction).

At least one first conductive via 73 extends along the direction in which first main surface 10a and second main surface 10b separate from each other, that is, the thickness direction of insulating substrate 10 (third direction (z direction)). At least one first conductive via 73 is connected to first ground pattern 11 and third ground pattern 71. At least one first conductive via 73 may be a plurality of first conductive vias 73. In other words, third ground pattern 71 may be electrically connected with first ground pattern 11 through a plurality of first conductive vias 73.

In a plan view of first main surface 10a (second main surface 10b) of insulating substrate 10, at least one first conductive via 73 may be disposed near first ground terminal 42c of first integrated circuit chip 40 and second ground terminal 46c of second integrated circuit chip 45.

In a plan view of first main surface 10a (second main surface 10b) of insulating substrate 10, the distance between at least one first conductive via 73 and first ground terminal 42c is, for example, one-hundredth or less of the electrical length inside printed board 9 of electromagnetic noise from connector 20. Thus, the potential difference between at least one first conductive via 73 and first ground terminal 42c resulting from electromagnetic noise is reduced, and a standing wave of electromagnetic noise in first ground pattern 11 can be prevented. Variation in potential of the first ground pattern 11 resulting from electromagnetic noise is suppressed, and malfunction or electrical breakdown of an electronic component electrically connected with first ground pattern 11 (first integrated circuit chip 40 and an electronic component other than first integrated circuit chip 40 (for example, an active electronic component such as integrated circuit chip 40b (see FIG. 4) or a light-emitting diode) can be prevented.

In a plan view of first main surface 10a (second main surface 10b) of insulating substrate 10, the distance between at least one first conductive via 73 and second ground terminal 46c is, for example, one-hundredth or less of the electrical length inside printed board 9 of electromagnetic noise from connector 20. Thus, the potential difference between at least one first conductive via 73 and second ground terminal 46c resulting from electromagnetic noise is reduced, and a standing wave of electromagnetic noise in third ground pattern 71 can be prevented. Variation in potential of third ground pattern 71 resulting from electromagnetic noise is suppressed, and malfunction or electrical breakdown of an electronic component electrically connected with third ground pattern 71 (second integrated circuit chip 45 and an electronic component other than second integrated circuit chip 45 (for example, an active electronic component such as an integrated circuit chip or a light-emitting diode) can be prevented.

Fourth ground pattern 75 is formed of, for example, a conductive material such as copper or aluminum. Fourth ground pattern 75 is provided, for example, on second main surface 10b. In a plan view of first main surface 10a (second main surface 10b) of insulating substrate 10, fourth ground pattern 75 overlaps second ground pattern 15. In particular, in a plan view of first main surface 10a (second main surface 10b) of insulating substrate 10, fourth ground pattern 75 may completely overlap second ground pattern 15.

In a plan view of second main surface 10b of insulating substrate 10, fourth ground pattern 75 is disposed in an outer peripheral region of insulating substrate 10 relative to third ground pattern 71. Fourth ground pattern 75 extends along outer edge portion 71c of third ground pattern 71. Fourth ground pattern 75 extends, for example, along the second direction (y direction). Fourth ground pattern 75 may have, for example, a stripe shape. The lengthwise direction of fourth ground pattern 75 is, for example, the second direction (y direction). The widthwise direction of fourth ground pattern 75 is, for example, the first direction (x direction).

Fourth ground pattern 75 separates from third ground pattern 71. Specifically, fourth ground pattern 75 separates from third ground pattern 71 in the first direction (x direction). Fourth ground pattern 75 is directly opposed to third ground pattern 71 (outer edge portion 71c) in a plan view of second main surface 10b of insulating substrate 10. In other words, in a plan view of second main surface 10b of insulating substrate 10, printed board 9 does not include a conductive pattern between third ground pattern 71 (outer edge portion 71c) and fourth ground pattern 75. No electronic component (excluding capacitor 52 shown in FIG. 16) is disposed on fourth ground pattern 75 or above fourth ground pattern 75 in a plan view of second main surface 10b of insulating substrate 10 (a plan view of first main surface 10a of insulating substrate 10).

Fourth ground pattern 75 is electrically connected to reference potential 59 such as ground potential. Specifically, second conductive via 77 extends along the direction in which first main surface 10a and second main surface 10b separate from each other, that is, the thickness direction of insulating substrate 10 (third direction (z direction)). Second conductive via 77 is connected to second ground pattern 15 and fourth ground pattern 75. Fourth ground pattern 75 is electrically connected with second ground pattern 15 through second conductive via 77. Fourth ground pattern 75 is connected to reference potential 59 through a conductor such as conductive wire 55, second ground pattern 15, and second conductive via 77. For example, second conductive via 77 is a hollow conductive member, and a part of fixing member 56, such as a body of a screw, may be fitted or threaded in the hole of second conductive via 77.

When electric cable 30 is connected to connector 20, fourth ground pattern 75 is electrically connected with sheath 32 of electric cable 30 through terminal 24c, chassis 21, connector body 31, and second ground pattern 15. Alternatively, when electric cable 30 is connected to connector 20, fourth ground pattern 75 is electrically connected with cable ground wiring 35c of electric cable 30 through terminal 24c, connector ground wiring 25c, terminal 23c, terminal 33c, and second ground pattern 15.

Second signal line pattern 13d is formed of, for example, a conductive material such as copper or aluminum. Second signal line pattern 13d is provided, for example, on second main surface 10b. Second signal line pattern 13d separates from third ground pattern 71 and fourth ground pattern 75 and is insulated from third ground pattern 71 and fourth ground pattern 75. Second signal line pattern 13d corresponds to second cable signal wiring 35d.

Connector 20 further includes second connector signal wiring 25d and terminals 23d, 24d. Connector 20 in the present embodiment is similar to connector 20 in the third embodiment but differs from connector 20 in the third embodiment in the following points. Terminal 24d is in contact with second signal line pattern 13d and electrically connected with second signal line pattern 13d. Terminal 24d is inserted in, for example, a hole (not shown) provided in insulating substrate 10. Terminal 24d may penetrate insulating substrate 10.

Printed circuit board 1d further includes a second integrated circuit chip 45. Second integrated circuit chip 45 in the present embodiment is similar to second integrated circuit chip 45 in the third embodiment but differs from second integrated circuit chip 45 in the third embodiment in the following points. Second integrated circuit chip 45 is disposed on third ground pattern 71. In a plan view of second main surface 10b of insulating substrate 10 (a plan view of first main surface 10a of insulating substrate 10), second integrated circuit chip 45 is disposed inside the outer edge of third ground pattern 71. In a plan view of second main surface 10b of insulating substrate 10 (a plan view of first main surface 10a of insulating substrate 10), second integrated circuit chip 45 may be disposed at the same position as first integrated circuit chip 40.

Second signal terminal 46a of second integrated circuit chip 45 corresponds to second signal line pattern 13d. Second signal terminal 46a is in contact with second signal line pattern 13d and electrically connected with second signal line pattern 13d. Second signal terminal 46a is electrically connected with second connector signal wiring 25d through second signal line pattern 13d. Specifically, second signal terminal 46a is electrically connected with second connector signal wiring 25d through second signal line pattern 13d and terminal 24d.

Second ground terminal 46c of second integrated circuit chip 45 is in contact with third ground pattern 71 and electrically connected with third ground pattern 71. Second ground terminal 46c is opposed to fourth ground pattern 75 in a plan view of second main surface 10b of insulating substrate 10 (a plan view of first main surface 10a of insulating substrate 10). The shortest distance between second ground terminal 46c and fourth ground pattern 75 is, for example, one-tenth or less of the electrical length inside printed board 9 of electromagnetic noise from connector 20. The shortest distance between second ground terminal 46c and fourth ground pattern 75 may be one-twentieth or less of the electrical length, one-fiftieth or less of the electrical length, or one-hundredth or less of the electrical length.

Figure 15:
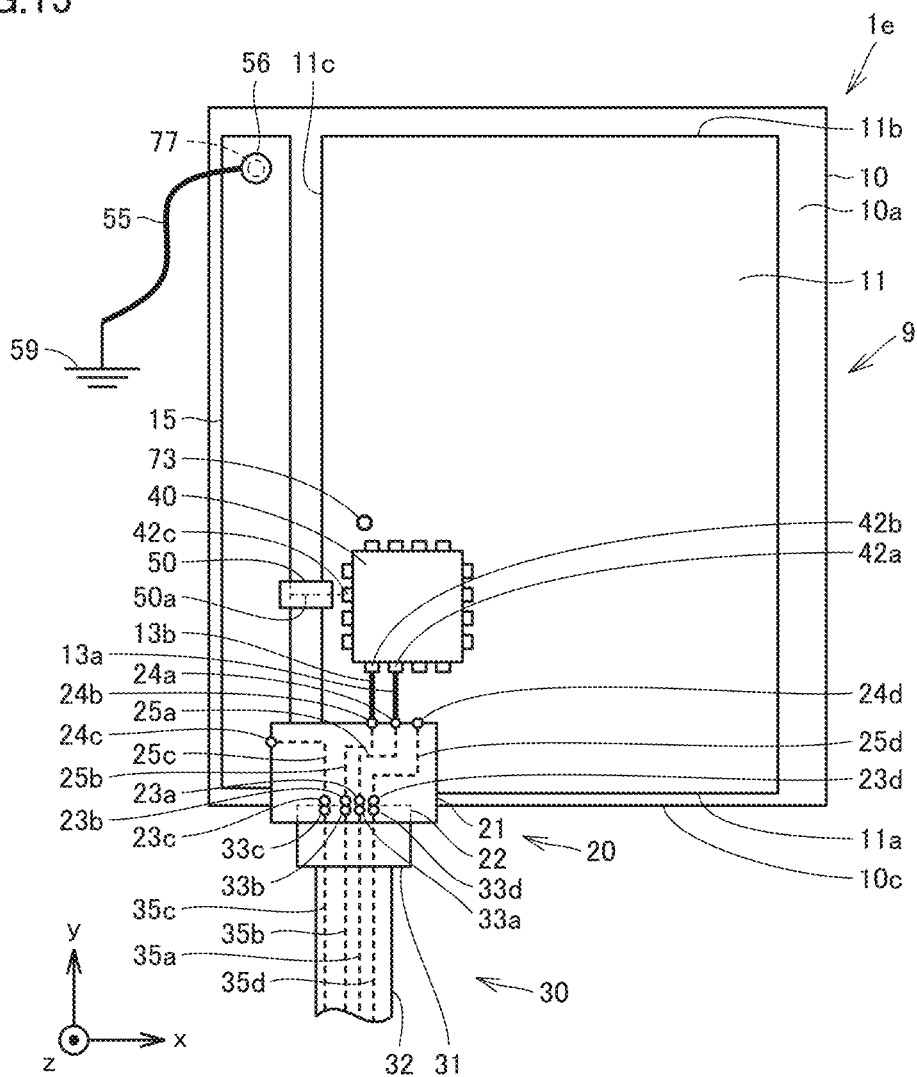
FIG. 15 is a schematic plan view of a printed circuit board in a modification of the fourth embodiment.
Figure 16:
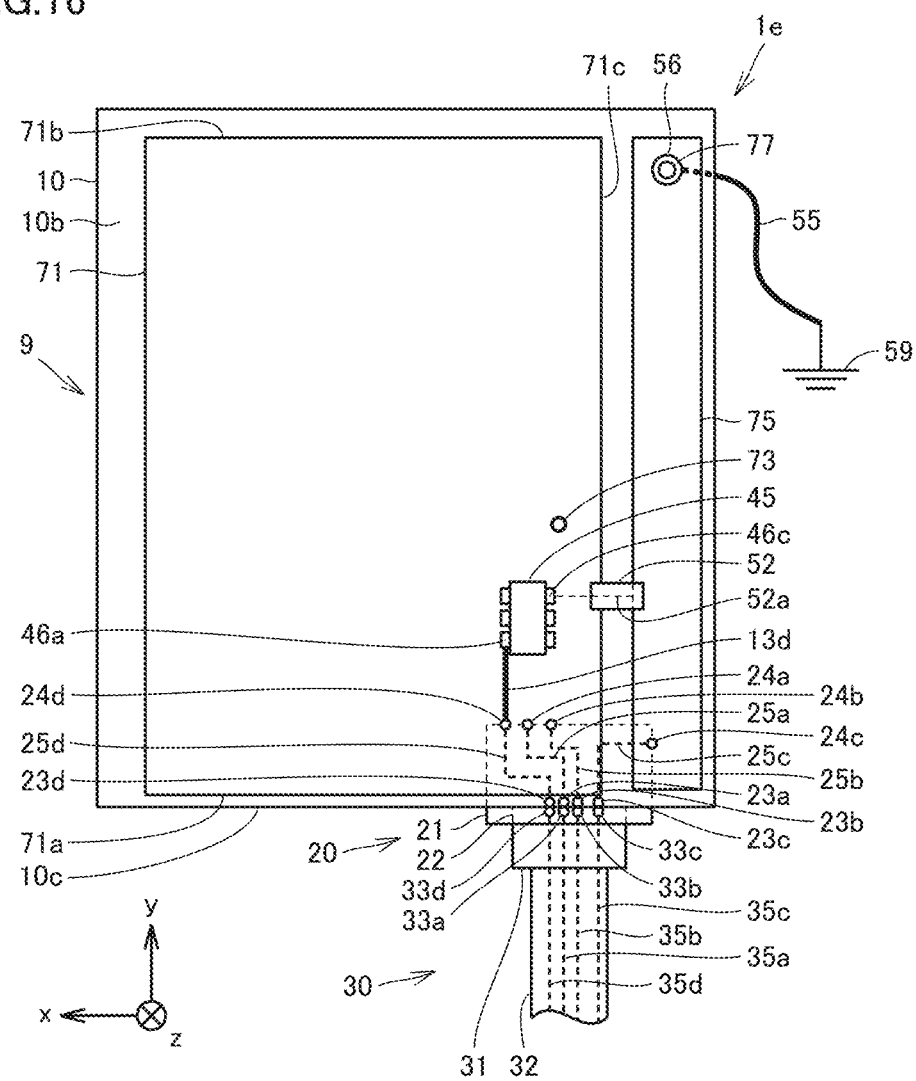
FIG. 16 is a schematic bottom view of the printed circuit board in the modification of the fourth embodiment.

Referring to FIG. 15 and FIG. 16, a printed circuit board 1e in a modification of the present embodiment will be described. Printed circuit board 1e has a configuration similar to printed circuit board 1d but differs mainly in the following points.

Printed circuit board 1e further includes a capacitor 52. Capacitor 52 in the modification of the present embodiment is similar to capacitor 52 in the third embodiment but differs from capacitor 52 in the third embodiment in the following points.

Capacitor 52 is connected to third ground pattern 71 and fourth ground pattern 75. Capacitor 52 may be the only capacitor that is connected to third ground pattern 71 and fourth ground pattern 75. In a plan view of first main surface 10a of insulating substrate 10, capacitor 52 is disposed on a straight line 52a that defines the shortest distance between second ground terminal 46c and fourth ground pattern 75. Straight line 52a extends, for example, along the first direction (x direction). In a plan view of first main surface 10a (second main surface 10b), capacitor 52 may be disposed at the same position as capacitor 50.

Printed circuit board 1d, 1e in the present embodiment achieves the following effects similar to the effects of printed circuit board 1c in the third embodiment.

Printed circuit board 1d, 1e in the present embodiment further includes second integrated circuit chip 45. Insulating substrate 10 includes second main surface 10b opposite first main surface 10a. Printed board 9 further includes third ground pattern 71, fourth ground pattern 75, second signal line pattern 13d, at least one first conductive via 73, and second conductive via 77. Fourth ground pattern 75 separates from third ground pattern 71 and is directly opposed to third ground pattern 71 in a plan view of first main surface 10a of insulating substrate 10. Second signal line pattern 13d is insulated from third ground pattern 71 and fourth ground pattern 75. At least one first conductive via 73 is connected to first ground pattern 11 and third ground pattern 71 and extends in the direction in which first main surface 10a and second main surface 10b separate from each other. Second conductive via 77 is connected to second ground pattern 15 and fourth ground pattern 75 and extends in the direction in which first main surface 10a and second main surface 10b separate from each other. Connector 20 further includes second connector signal wiring 25d provided inside chassis 21. Second integrated circuit chip 45 includes second ground terminal 46c and second signal terminal 46a. Second ground terminal 46c is electrically connected with third ground pattern 71 and opposed to fourth ground pattern 75 in a plan view of first main surface 10a of insulating substrate 10. Second signal terminal 46a is electrically connected with second connector signal wiring 25d through second signal line pattern 13d.

Thus, electromagnetic noise from electric cable 30 into second integrated circuit chip 45 does not spread to the entire third ground pattern 71 but flows into second ground pattern 15 through the first capacitor (capacitor 50). Malfunction or electrical breakdown of an electronic component electrically connected with third ground pattern 71 (second integrated circuit chip 45 and an electronic component other than second integrated circuit chip 45 (for example, an active electronic component such as an integrated circuit chip or a light-emitting diode) can be prevented.

In printed circuit board 1d, 1e in the present embodiment, at least one first conductive via 73 is a plurality of first conductive vias 73.

Thus, the inductance of the conductor (a plurality of first conductive vias 73) connecting first ground pattern 11 and third ground pattern 71 to each other is reduced. Electromagnetic noise from electric cable 30 into second integrated circuit chip 45 does not spread to the entire third ground pattern 71 but flows into second ground pattern 15 through a plurality of first conductive vias 73, first ground pattern 11, and the first capacitor (capacitor 50). Malfunction or electrical breakdown of an electronic component electrically connected with third ground pattern 71 (second integrated circuit chip 45 and an electronic component other than second integrated circuit chip 45 (for example, an active electronic component such as an integrated circuit chip or a light-emitting diode) can be prevented.

Printed circuit board 1e in the present embodiment further includes a second capacitor (for example, capacitor 52) mounted on printed board 9. The second capacitor is connected to third ground pattern 71 and fourth ground pattern 75 and disposed on straight line 52a that defines the shortest distance between second ground terminal 46c and fourth ground pattern 75 in a plan view of first main surface 10a of insulating substrate 10.

Thus, electromagnetic noise from electric cable 30 into second integrated circuit chip 45 does not spread to the entire third ground pattern 71 but flows also into fourth ground pattern 75 through the second capacitor (for example, capacitor 52). Malfunction or electrical breakdown of an electronic component electrically connected with third ground pattern 71 (second integrated circuit chip 45 and an electronic component other than second integrated circuit chip 45 (for example, an active electronic component such as an integrated circuit chip or a light-emitting diode) can be prevented.

In printed circuit board 1e in the present embodiment, in a plan view of first main surface 10a of insulating substrate 10, the second capacitor (for example, capacitor 52) is disposed at the same position as the first capacitor (for example, capacitor 50).

Thus, electromagnetic noise from electric cable 30 into first integrated circuit chip 40 and second integrated circuit chip 45 does not spread to the entire first ground pattern 11 and the entire third ground pattern 71 but flows into second ground pattern 15 and fourth ground pattern 75 through the first capacitor (for example, capacitor 50) and the second capacitor (for example, capacitor 52). Malfunction or electrical breakdown of an electronic component electrically connected with first ground pattern 11 (first integrated circuit chip 40 and an electronic component other than first integrated circuit chip 40 (for example, an active electronic component such as integrated circuit chip 40b (see FIG. 4) or a light-emitting diode), and an electronic component electrically connected with third ground pattern 71 (second integrated circuit chip 45 and an electronic component other than second integrated circuit chip 45 (for example, an active electronic component such as an integrated circuit chip or a light-emitting diode) can be prevented.

Fifth Embodiment

Figure 17:
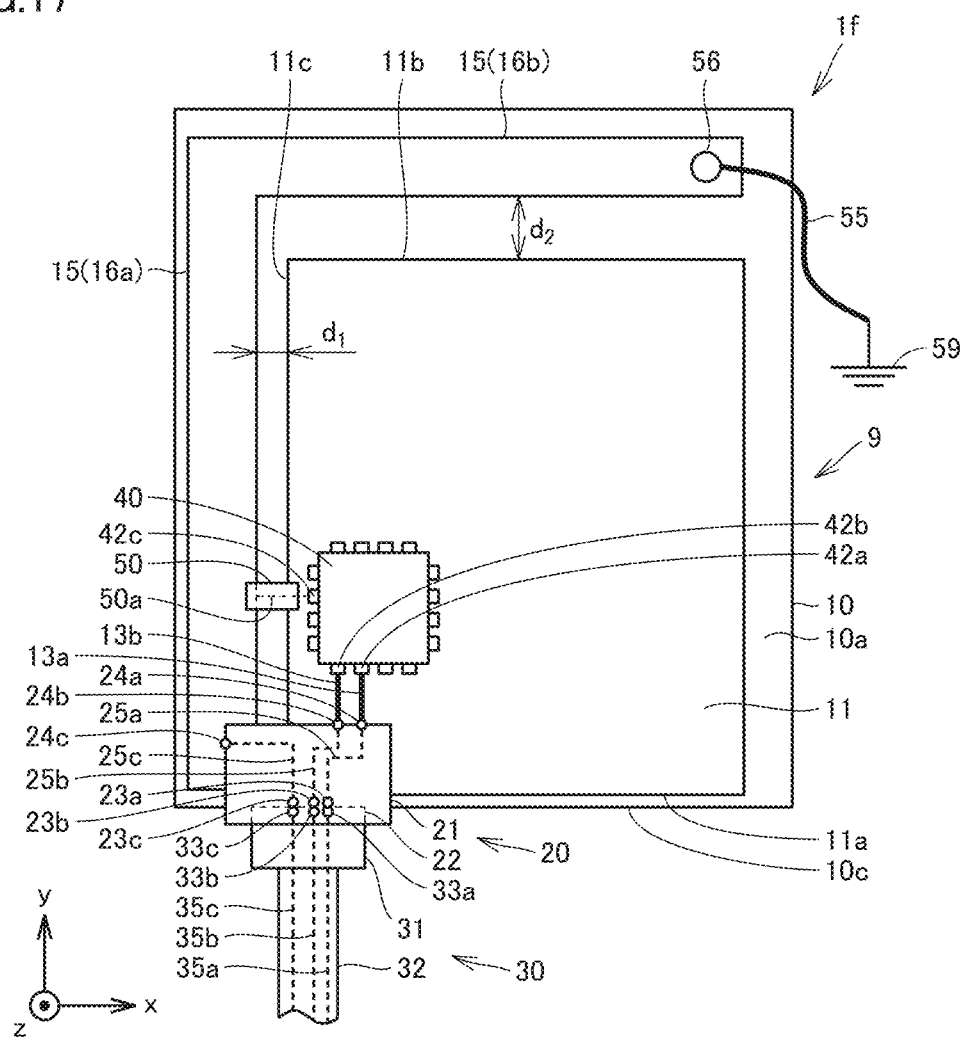
FIG. 17 is a schematic plan view of a printed circuit board in a fifth embodiment.

Referring to FIG. 17, a printed circuit board 1f in a fifth embodiment will be described. Printed circuit board 1f in the present embodiment has a configuration similar to printed circuit board 1 in the first embodiment but differs mainly in the following points.

In the present embodiment, second ground pattern 15 includes a first ground pattern portion 16a and a second ground pattern portion 16b.

First ground pattern portion 16a in the present embodiment is similar to first ground pattern portion 16a in the third embodiment. First ground pattern portion 16a is disposed at a gap $d_1$ from first ground pattern 11 (outer edge portion 11c).

Second ground pattern portion 16b is similar to second ground pattern portion 16b in the third embodiment but differs in the following points.

Second ground pattern portion 16b is connected to first ground pattern portion 16a at a distal end of first ground pattern portion 16a relative to outer edge portion 11a of first ground pattern 11 (outer edge portion 10c of insulating substrate 10). Second ground pattern portion 16b separates from first ground pattern 11 (outer edge portion 11b). Specifically, second ground pattern portion 16b separates from first ground pattern 11 (outer edge portion 11b) in the second direction (y direction). Second ground pattern portion 16b is disposed at a gap $d_2$ from first ground pattern 11 (outer edge portion 11b).

Second ground pattern portion 16b is directly opposed to first ground pattern 11 (outer edge portion 11b) in a plan view of first main surface 10a of insulating substrate 10. In other words, in a plan view of first main surface 10a of insulating substrate 10, printed board 9 does not include a conductive pattern between first ground pattern 11 (outer edge portion 11b) and second ground pattern portion 16b. No electronic component may be disposed on second ground pattern portion 16b or above second ground pattern portion 16b in a plan view of second main surface 10b of insulating substrate 10 (a plan view of first main surface 10a of insulating substrate 10).

Gap $d_1$ between first ground pattern portion 16a and first ground pattern 11 is smaller than gap $d_2$ between second ground pattern portion 16b and first ground pattern 11.

The conductor (for example, conductive wire 55) is fixed to second ground pattern portion 16b, using fixing member 56 such as a screw, at a distal end of second ground pattern portion 16b relative to first ground pattern portion 16a.

Capacitor 50 in the present embodiment is connected to first ground pattern 11 and first ground pattern portion 16a and disposed on straight line 50a that defines the shortest distance between first ground terminal 42c and first ground pattern portion 16a in a plan view of first main surface 10a of insulating substrate 10, similarly to capacitor 50 in the third embodiment.

Figure 18:
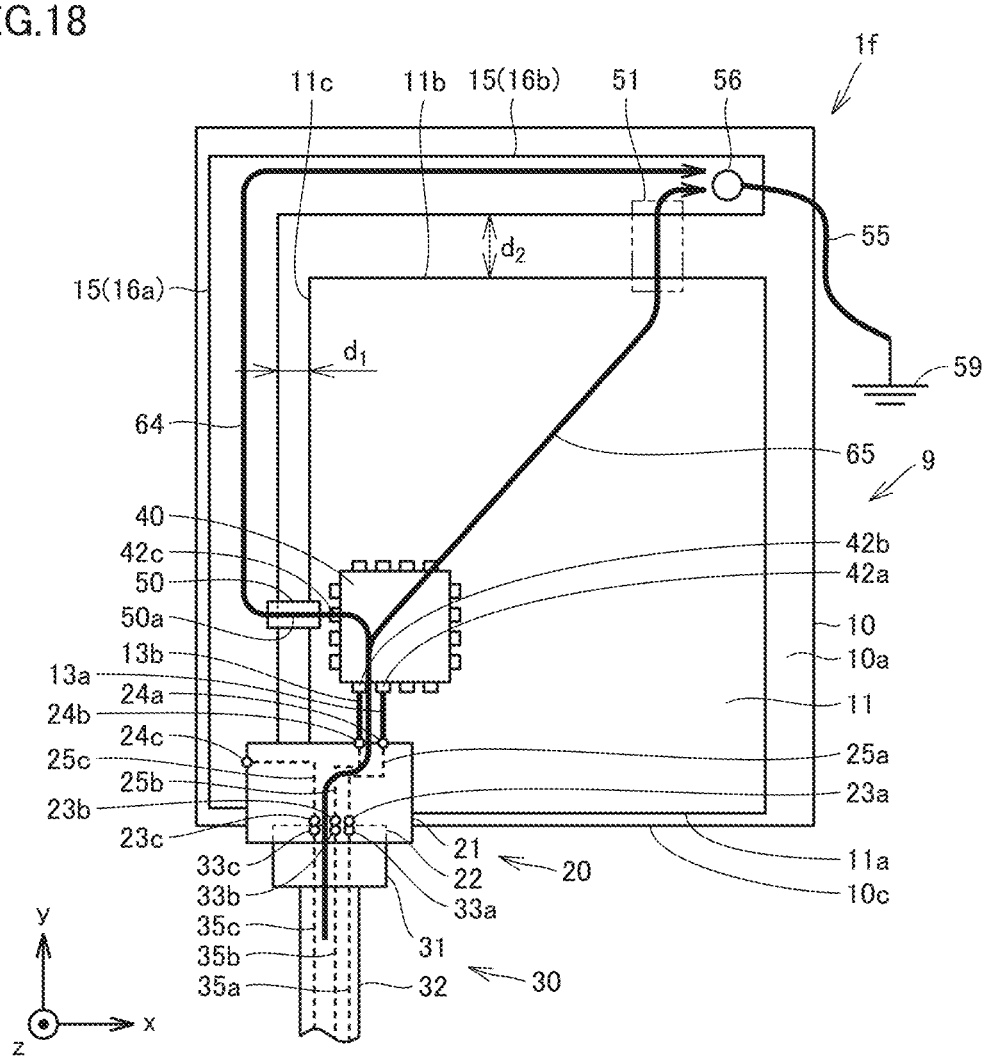
FIG. 18 is a schematic plan view of the printed circuit board in the fifth embodiment showing a path of electromagnetic noise.

Referring to FIG. 18, the operation of printed circuit board 1f in the present embodiment will be described.

In the present embodiment, gap $d_1$ between first ground pattern portion 16a and first ground pattern 11 is smaller than gap $d_2$ between second ground pattern portion 16b and first ground pattern 11. Thus, electromagnetic noise from electric cable 30 into first integrated circuit chip 40 does not directly flow from first ground pattern 11 into second ground pattern portion 16b but flows into first ground pattern portion 16a through capacitor 50 (see noise path 64 in FIG. 18). Spreading of electromagnetic noise to the entire first ground pattern 11 can be prevented. Malfunction or electrical breakdown of an electronic component electrically connected with first ground pattern 11 (first integrated circuit chip 40 and an electronic component other than first integrated circuit chip 40 (for example, an active electronic component such as integrated circuit chip 40b (see FIG. 4) or a light-emitting diode) can be prevented.

Further, even when capacitor 51 electrically connected with second ground pattern portion 16b and first ground pattern 11 is disposed between second ground pattern portion 16b and first ground pattern 11, it is possible to reduce electromagnetic noise spreading to the entire first ground pattern 11 and flowing from first ground pattern 11 into second ground pattern portion 16b through capacitor 51 (see noise path 65 in FIG. 18).

It is preferable that capacitor 51 electrically connected with second ground pattern portion 16b and first ground pattern 11 is not disposed between second ground pattern portion 16b and first ground pattern 11, for the following reason. Part of electromagnetic noise from electric cable 30 into first integrated circuit chip 40 may sometimes flow from first ground pattern 11 into second ground pattern portion 16b through capacitor 51 (see noise path 65 in FIG. 18). Part of electromagnetic noise spreads to the entire first ground pattern 11. An electronic component electrically connected with first ground pattern 11 (first integrated circuit chip 40 and an electronic component other than first integrated circuit chip 40 (for example, an active electronic component such as integrated circuit chip 40b (see FIG. 4) or a light-emitting diode) may malfunction or be electrically broken.

Printed circuit board 1f in the present embodiment further achieves the following effects in addition to the effects of printed circuit board 1 in the first embodiment.

In printed circuit board 1f in the present embodiment, in a plan view of first main surface 10a of insulating substrate 10, first ground pattern 11 includes a first outer edge portion (for example, outer edge portion 11b) and a second outer edge portion (for example, outer edge portion 11c). The second outer edge portion is connected to the first outer edge portion and extends in a direction different from the first outer edge portion. Second ground pattern 15 includes first ground pattern portion 16a and second ground pattern portion 16b. First ground pattern portion 16a extends along the second outer edge portion. Second ground pattern portion 16b extends along the first outer edge portion and is connected to first ground pattern portion 16a. The first capacitor (capacitor 50) is connected to first ground pattern 11 and first ground pattern portion 16a and disposed on straight line 50a that defines the shortest distance between first ground terminal 42c and first ground pattern portion 16a in a plan view of first main surface 10a of insulating substrate 10. Gap $d_1$ between first ground pattern portion 16a and first ground pattern 11 is smaller than gap $d_2$ between second ground pattern portion 16b and first ground pattern 11.

Thus, electromagnetic noise from electric cable 30 into first integrated circuit chip 40 does not directly flow from first ground pattern 11 into second ground pattern portion 16b but flows into first ground pattern portion 16a through capacitor 50. Spreading of electromagnetic noise to the entire first ground pattern 11 can be prevented. Malfunction or electrical breakdown of an electronic component electrically connected with first ground pattern 11 (first integrated circuit chip 40 and an electronic component other than first integrated circuit chip 40 (for example, an active electronic component such as integrated circuit chip 40b (see FIG. 4) or a light-emitting diode) can be prevented.

Sixth Embodiment

Figure 19:
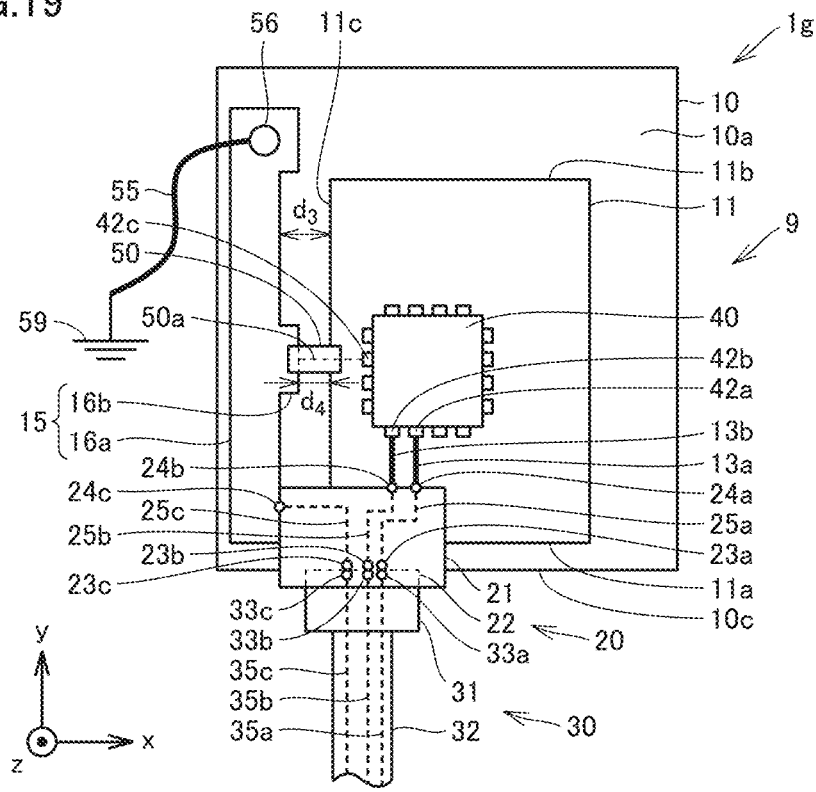
FIG. 19 is a schematic plan view of a printed circuit board in a sixth embodiment.

Referring to FIG. 19, a printed circuit board 1g in a sixth embodiment will be described. Printed circuit board 1g in the present embodiment has a configuration similar to printed circuit board 1b in the second embodiment but differs mainly in the following points.

First ground pattern 11 in the present embodiment is similar to first ground pattern 11 in the second embodiment but differs from first ground pattern 11 in the second embodiment in the following points. Recess 12 (see FIG. 11) in the second embodiment is not provided in first ground pattern 11 in the present embodiment. In other words, first ground pattern 11 in the present embodiment is similar to first ground pattern 11 in the first embodiment.

In the present embodiment, second ground pattern 15 includes a first ground pattern portion 16a and a second ground pattern portion 16b. First ground pattern portion 16a in the present embodiment is similar to first ground pattern portion 16a in the second embodiment. First ground pattern portion 16a is disposed at a gap $d_3$ from first ground pattern 11 (outer edge portion 11c).

Second ground pattern portion 16b in the present embodiment is similar to second ground pattern portion 16b in the second embodiment but differs from second ground pattern portion 16b in the second embodiment in the following points. Second ground pattern portion 16b separates from first ground pattern 11 (outer edge portion 11c) in the first direction (x direction). Second ground pattern portion 16b is disposed at a gap $d_4$ from first ground pattern 11 (outer edge portion 11c). Gap $d_4$ between second ground pattern portion 16b and first ground pattern 11 in the direction of protrusion of second ground pattern portion 16b from first ground pattern portion 16a (for example, first direction (x direction)) is smaller than gap $d_3$ between first ground pattern portion 16a and first ground pattern 11 in the direction of protrusion.

First integrated circuit chip 40 in the present embodiment is similar to first integrated circuit chip 40 in the second embodiment but differs from first integrated circuit chip 40 in the second embodiment in the following points. First ground terminal 42c in the present embodiment is opposed to second ground pattern portion 16b in the first direction (x direction).

Capacitor 50 in the present embodiment is similar to capacitor 50 in the second embodiment but differs from capacitor 50 in the second embodiment in the following points. Straight line 50a that defines the shortest distance between first ground terminal 42c and second ground pattern portion 16b extends along the direction of protrusion of second ground pattern portion 16b from first ground pattern portion 16a (for example, the first direction (x direction)). Capacitor 50 is disposed on this straight line 50a. In other words, capacitor 50 is connected to first ground pattern 11 and second ground pattern 15 (second ground pattern portion 16b) at a portion with a relatively smaller gap between first ground pattern 11 and second ground pattern 15 in second ground pattern 15.

Printed circuit board 1g in the present embodiment further achieves the following effects in addition to the effects of printed circuit board 1 in the first embodiment.

In printed circuit board 1g in the present embodiment, second ground pattern 15 includes first ground pattern portion 16a and second ground pattern portion 16b. Second ground pattern portion 16b protrudes from first ground pattern portion 16a toward first ground pattern 11. Gap $d_4$ between second ground pattern portion 16b and first ground pattern 11 in the direction of protrusion of second ground pattern portion 16b from first ground pattern portion 16a is smaller than gap $d_3$ between first ground pattern portion 16a and first ground pattern 11 in the direction of protrusion. In a plan view of first main surface 10a of insulating substrate 10, first ground terminal 42c is opposed to second ground pattern portion 16b. The first capacitor (capacitor 50) is connected to first ground pattern 11 and second ground pattern portion 16b and disposed on straight line 50a that defines the shortest distance between first ground terminal 42c and second ground pattern portion 16b and extends along the direction of protrusion of second ground pattern portion 16b.

Thus, electromagnetic noise from electric cable 30 into first integrated circuit chip 40 can be further prevented from spreading to the entire first ground pattern 11. Malfunction or electrical breakdown of an electronic component electrically connected with first ground pattern 11 (first integrated circuit chip 40 and an electronic component other than first integrated circuit chip 40 (for example, an active electronic component such as integrated circuit chip 40b (see FIG. 4) or a light-emitting diode) can be prevented.

Seventh Embodiment

Figure 20:
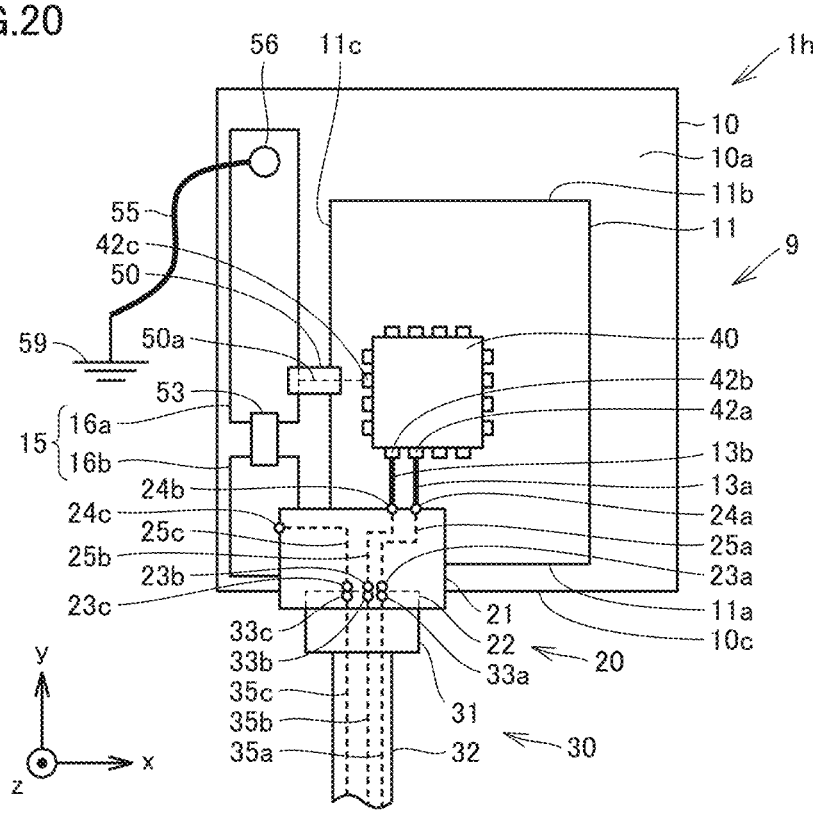
FIG. 20 is a schematic plan view of a printed circuit board in a seventh embodiment.

Referring to FIG. 20, a printed circuit board 1h in a seventh embodiment will be described. Printed circuit board 1h in the present embodiment has a configuration similar to printed circuit board 1c in the third embodiment but differs mainly in the following points.

In the present embodiment, chassis 21 is a conductive chassis. Electromagnetic noise flows into printed board 9 through chassis 21.

Second ground pattern 15 includes a first ground pattern portion 16a and a second ground pattern portion 16b.

First ground pattern portion 16a in the present embodiment is similar to first ground pattern portion 16a in the third embodiment but differs from first ground pattern portion 16a in the third embodiment in the following points. The length of first ground pattern portion 16a in the present embodiment in the lengthwise direction (second direction (y direction)) of first ground pattern portion 16a is smaller than the length of first ground pattern portion 16a in the third embodiment in the lengthwise direction of first ground pattern portion 16a. First ground pattern portion 16a is not in contact with chassis 21 and terminal 24c and apart from chassis 21 and terminal 24c.

Second ground pattern portion 16b in the present embodiment is similar to second ground pattern portion 16b in the third embodiment but differs from second ground pattern portion 16b in the third embodiment in the following points.

Second ground pattern portion 16b separates from first ground pattern portion 16a. For example, second ground pattern portion 16b separates from first ground pattern portion 16a in the lengthwise direction (second direction (y direction)) of first ground pattern portion 16a. Second ground pattern portion 16b extends along outer edge portion 11c of first ground pattern 11. Second ground pattern portion 16b extends, for example, along the second direction (y direction). Second ground pattern portion 16b may have, for example, a stripe shape. The lengthwise direction of second ground pattern portion 16b is, for example, the second direction (y direction). The widthwise direction of second ground pattern portion 16b is, for example, the first direction (x direction).

Second ground pattern portion 16b separates from first ground pattern 11 (outer edge portion 11c). Specifically, second ground pattern portion 16b separates from first ground pattern 11 (outer edge portion 11c) in the first direction (x direction). Second ground pattern portion 16b is directly opposed to first ground pattern 11 (outer edge portion 11c) in a plan view of first main surface 10a of insulating substrate 10. In other words, in a plan view of first main surface 10a of insulating substrate 10, printed board 9 does not include a conductive pattern between first ground pattern 11 (outer edge portion 11c) and second ground pattern portion 16b.

Second ground pattern portion 16b is electrically connected with the conductive chassis (chassis 21). Second ground pattern portion 16b may be in contact with the conductive chassis or may be electrically connected with the conductive chassis through terminal 24c in contact with second ground pattern portion 16b.

Printed circuit board 1h further includes a capacitor 53. Capacitor 53 is, for example, a multilayer ceramic capacitor or an aluminum electrolytic capacitor. Capacitor 53 is mounted on printed board 9. Capacitor 53 is connected to first ground pattern portion 16a and second ground pattern portion 16b. Capacitor 53 can reflect electromagnetic noise from the conductive chassis (chassis 21) into second ground pattern portion 16b, thereby reducing or eliminating electromagnetic noise from second ground pattern portion 16b into first ground pattern portion 16a. Capacitor 53 can reduce or eliminate electromagnetic noise from first ground pattern portion 16a into first ground pattern 11 through capacitor 50.

Figure 21:
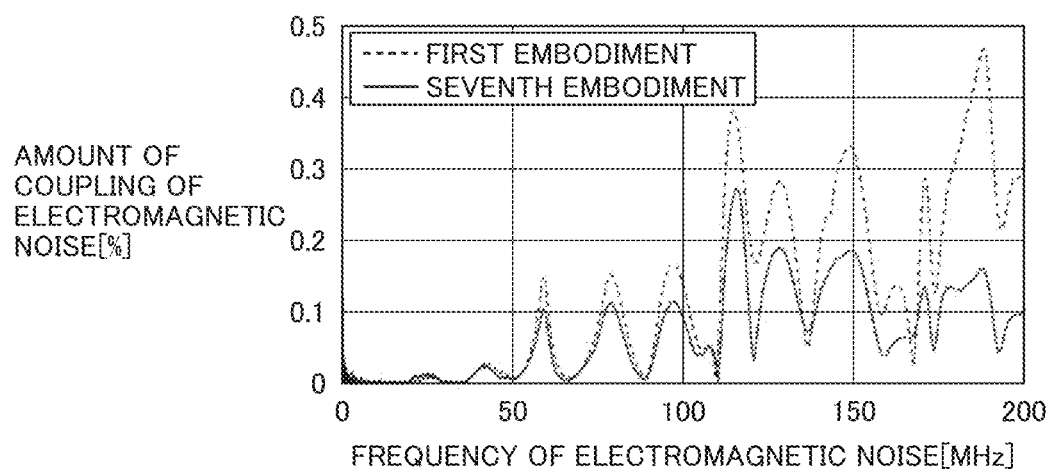
FIG. 21 is a graph showing the amount of coupling of electromagnetic noise to an integrated circuit chip in the first embodiment and the seventh embodiment.

Referring to FIG. 21, the operation of printed circuit board 1h in the present embodiment with capacitor 53 will be described. FIG. 21 shows the amount of coupling of electromagnetic noise to first integrated circuit chip 40 in the present embodiment and the first embodiment when electromagnetic noise is applied to electric cable 30. The amount of coupling of electromagnetic noise to first integrated circuit chip 40 is measured by bringing a probe for electromagnetic noise detection into contact with first signal terminals 42a, 42b of first integrated circuit chip 40. It can be understood that the amount of coupling of electromagnetic noise to first integrated circuit chip 40 in the present embodiment is smaller than the amount of coupling of electromagnetic noise to first integrated circuit chip 40 in the first embodiment.

The capacity of capacitor 53 is, for example, 5.0 µF or less. The capacity of capacitor 53 may be, for example, 2.0 µF or less or may be 1.0 µF or less. Thus, excessive decrease of the impedance of capacitor 53 for low-frequency electromagnetic noise (for example, electromagnetic noise having a frequency of 100 kHz or lower) resulting from lightning or the like is prevented. Capacitor 53 can reflect more low-frequency electromagnetic noise and further reduce or eliminate low-frequency electromagnetic noise from first ground pattern portion 16a and capacitor 50 into first ground pattern 11. Variation in potential of first ground pattern 11 resulting from low-frequency electromagnetic noise is suppressed, and malfunction or electrical breakdown of an electronic component electrically connected with first ground pattern 11 (first integrated circuit chip 40 and an electronic component other than first integrated circuit chip 40 (for example, an active electronic component such as integrated circuit chip 40b (see FIG. 4) or a light-emitting diode) can be prevented.

The capacity of capacitor 53 is, for example, 0.01 µF or more. Thus, excessive increase of the impedance of capacitor 53 for high-frequency electromagnetic noise (for example, electromagnetic noise having a frequency of 1 MHz or higher) resulting from a typical electronic device is prevented. High-frequency electromagnetic noise from electric cable 30 into second ground pattern portion 16b can be reflected by capacitor 53 and prevented from flowing into first signal line patterns 13a, 13b and first ground pattern 11 due to parasitic capacitance inside electric cable 30 or parasitic capacitance inside connector 20. Variation in potential of first ground pattern 11 resulting from high-frequency electromagnetic noise is suppressed, and malfunction or electrical breakdown of an electronic component electrically connected with first ground pattern 11 (first integrated circuit chip 40 and an electronic component other than first integrated circuit chip 40 (for example, an active electronic component such as integrated circuit chip 40b (see FIG. 4) or a light-emitting diode) can be prevented.

Figure 22:
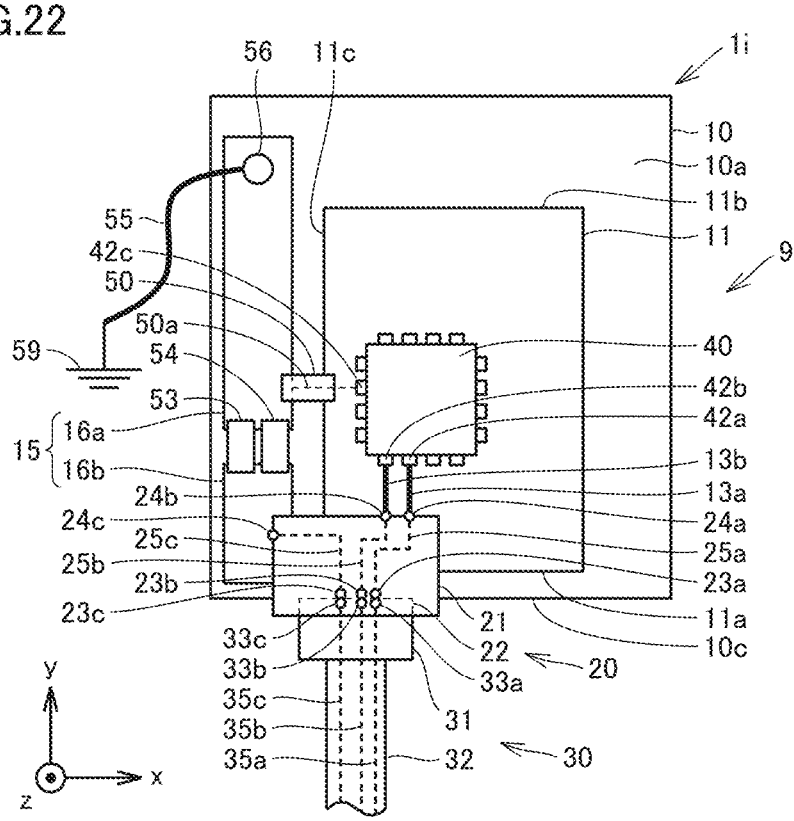
FIG. 22 is a schematic plan view of a printed circuit board in a modification of the seventh embodiment.

Referring to FIG. 22, a printed circuit board 1i in a modification of the present embodiment will be described.

Printed circuit board 1i further includes a resistor 54. Resistor 54 is mounted on printed board 9. Specifically, resistor 54 is connected to first ground pattern portion 16a and second ground pattern portion 16b. The second capacitor (for example, capacitor 53) and resistor 54 are disposed in parallel between first ground pattern portion 16a and second ground pattern portion 16b. Resistor 54 can prevent printed board 9 from being charged.

The impedance of resistor 54 is, for example, 10 kΩ or more. This is because if the impedance of resistor 54 is excessively low, low-frequency electromagnetic noise (for example, electromagnetic noise having a frequency of 100 kHz or lower) resulting from lightning or the like passes through resistor 54, and the effect of cutting off low-frequency electromagnetic noise by capacitor 53 is unable to be achieved sufficiently. The impedance of resistor 54 is, for example, 10 MΩ or less. The impedance of resistor 54 may be, for example, 1 MΩ or less. Thus, excessive increase in the impedance of resistor 54 can be prevented. Resistor 54 can effectively prevent printed board 9 from being charged.

Printed circuit board 1h, 1i in the present embodiment further achieves the following effects in addition to the effects of printed circuit board 1 in the first embodiment.

Printed circuit board 1h, 1i in the present embodiment further includes a second capacitor (capacitor 53) mounted on printed board 9. Chassis 21 is a conductive chassis. Second ground pattern 15 includes first ground pattern portion 16a and second ground pattern portion 16b separating from first ground pattern portion 16a. Second ground pattern portion 16b is electrically connected with the conductive chassis. The first capacitor (for example, capacitor 50) is connected to first ground pattern 11 and first ground pattern portion 16a and disposed on straight line 50a that defines the shortest distance between first ground terminal 42c and first ground pattern portion 16a in a plan view of first main surface 10a of insulating substrate 10. The second capacitor is connected to first ground pattern portion 16a and second ground pattern portion 16b.

The second capacitor (capacitor 53) can reflect electromagnetic noise from the conductive chassis (chassis 21) into second ground pattern portion 16b, thereby reducing or eliminating electromagnetic noise from second ground pattern portion 16b into first ground pattern portion 16a. The second capacitor can reduce or eliminate electromagnetic noise from first ground pattern portion 16a into first ground pattern 11 through the first capacitor (capacitor 50). Malfunction or electrical breakdown of an electronic component electrically connected with first ground pattern 11 (first integrated circuit chip 40 and an electronic component other than first integrated circuit chip 40 (for example, an active electronic component such as integrated circuit chip 40b (see FIG. 4) or a light-emitting diode) can be prevented.

Printed circuit board 1i in the present embodiment further includes resistor 54 mounted on printed board 9. Resistor 54 is connected to first ground pattern portion 16a and second ground pattern portion 16b. The second capacitor (capacitor 53) and resistor 54 are disposed in parallel between first ground pattern portion 16a and second ground pattern portion 16b.

Resistor 54 can prevent printed circuit board 1i from being charged. Malfunction or electrical breakdown of an electronic component mounted on printed circuit board 1i (first integrated circuit chip 40 and an electronic component other than first integrated circuit chip 40 (for example, an active electronic component such as integrated circuit chip 40b (see FIG. 4) or a light-emitting diode) can be prevented.

Eighth Embodiment

Figure 23:
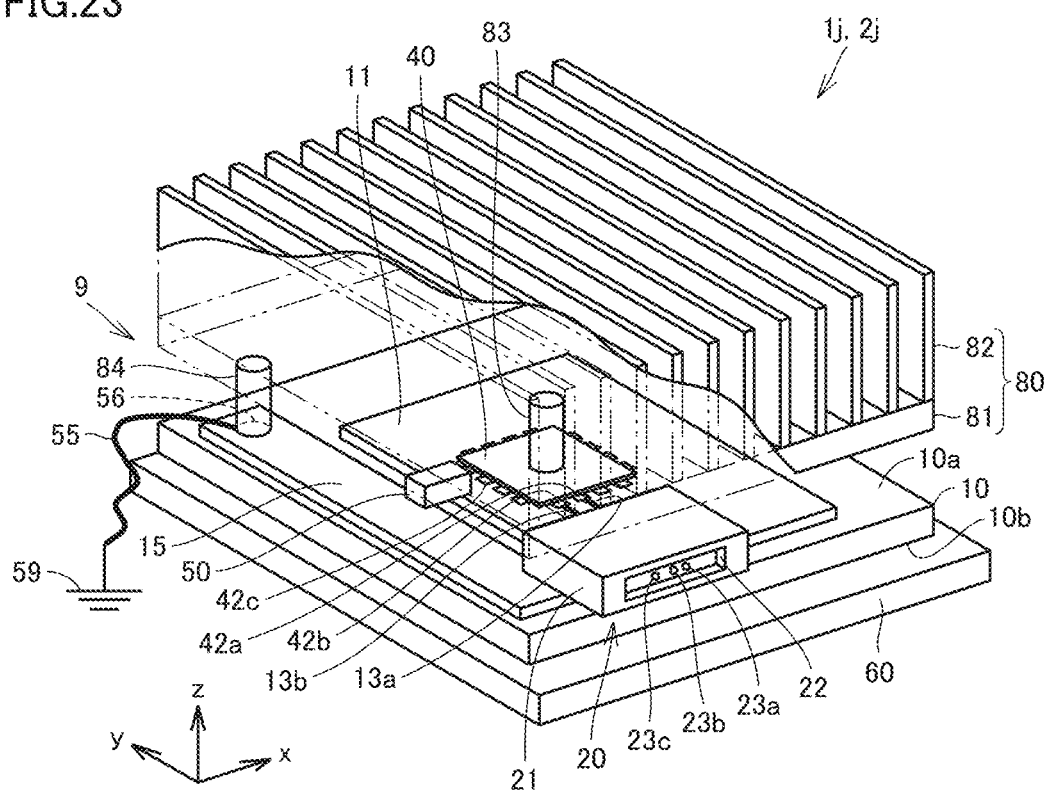
FIG. 23 is a perspective view of an electronic device in an eighth embodiment.

Referring to FIG. 23, an electronic device 2j and a printed circuit board 1j in an eighth embodiment will be described. Electronic device 2j and printed circuit board 1j in the present embodiment have a configuration similar to electronic device 2 and printed circuit board 1 in the first embodiment but differ mainly in the following points.

Electronic device 2j in the present embodiment includes printed circuit board 1j in the present embodiment, instead of printed circuit board 1 in the first embodiment. Printed circuit board 1j in the present embodiment further includes a heatsink 80 and heat transfer materials 83, 84 in addition to printed board 9 in the first embodiment. In the present description, the heat transfer member means a member formed of a material having a thermal conductivity of 0.1 W/(m·K) or more.

Heatsink 80 includes, for example, a heat dissipating plate 81 and heat dissipating fins 82. Heatsink 80 (heat dissipating plate 81) is opposed to first main surface 10a of insulating substrate 10. Heatsink 80 (heat dissipating plate 81) is disposed so as to separate from first main surface 10a of insulating substrate 10. Heat dissipating fins 82 are connected to heat dissipating plate 81. Specifically, heat dissipating fins 82 are formed on a front surface of heat dissipating plate 81 opposite a rear surface of heat dissipating plate 81 opposed to first main surface 10a of insulating substrate 10.

Heat transfer material 83 is connected to first integrated circuit chip 40 and heatsink 80 (for example, heat dissipating plate 81). Heat transfer material 83 may be an insulating spacer or a conductive spacer. Heat transfer material 83 is, for example, thermal grease or heat dissipating sheet. The thermal grease may be formed of, for example, silicone resin containing a filler such as magnetic filler. Heat transfer material 84 is connected to second ground pattern 15 and heatsink 80 (for example, heat dissipating plate 81). Heat transfer material 84 is a conductive spacer. Heat transfer material 84 is formed of, for example, metal. Heat transfer material 84 may be, for example, a screw fixing heatsink 80 to insulating substrate 10.

Heatsink 80 separates from connector 20. Thus, electromagnetic noise into sheath 32 of electric cable 30 (see FIG. 2) can be prevented from passing through chassis 21 (see FIG. 2) of connector 20, heatsink 80, and heat transfer material 83 and propagating to first integrated circuit chip 40 and an electronic component other than first integrated circuit chip 40 electrically connected with first ground pattern 11 (for example, an active electronic component such as integrated circuit chip 40b (see FIG. 4) or a light-emitting diode). Malfunction or electrical breakdown of an electronic component electrically connected with first ground pattern 11 (first integrated circuit chip 40 and an electronic component other than first integrated circuit chip 40) can be prevented.

In a modification of the present embodiment, heatsink 80 may be in contact with connector 20 (chassis 21). For example, when an electrical filter is provided inside chassis 21 of connector 20, the temperature of connector 20 may sometimes become high during operation of electronic device 2j. Heatsink 80 is brought into contact with connector 20 so that heatsink 80 can cool connector 20.

When heatsink 80 is in contact with connector 20 (chassis 21), electromagnetic noise from connector 20 into heatsink 80 may couple to first integrated circuit chip 40 due to parasitic capacitance in heat transfer material 83, and first integrated circuit chip 40 and an electronic component other than first integrated circuit chip 40 electrically connected with first ground pattern 11 (for example, an active electronic component such as integrated circuit chip 40b (see FIG. 4) or a light-emitting diode) may malfunction or be electrically broken. With the height of heat transfer material 83 set to 1 mm or more, the parasitic capacitance in heat transfer material 83 is reduced, and electromagnetic noise coupled to first integrated circuit chip 40 and an electronic component other than first integrated circuit chip 40 electrically connected with first ground pattern 11 is reduced. Malfunction or electrical breakdown of an electronic component electrically connected with first ground pattern 11 (first integrated circuit chip 40 and an electronic component other than first integrated circuit chip 40) can be prevented.

Heat transfer material 84 serving as a conductive spacer enables electromagnetic noise from connector 20 (chassis 21) into heatsink 80 to escape to reference potential 59 via second ground pattern 15. Malfunction or electrical breakdown of an electronic component electrically connected with first ground pattern 11 (first integrated circuit chip 40 and an electronic component other than first integrated circuit chip 40) can be prevented.

Printed circuit board 1j in the present embodiment further achieves the following effects in addition to the effects of printed circuit board 1 in the first embodiment.

Printed circuit board 1j in the present embodiment further includes heatsink 80 and heat transfer material 83. Heatsink 80 is opposed to first main surface 10a and disposed so as to separate from first main surface 10a. Heat transfer material 83 is connected to first integrated circuit chip 40 and heatsink 80. Heatsink 80 separates from connector 20.

Thus, first integrated circuit chip 40 is cooled by heatsink 80. Malfunction or thermal breakdown of first integrated circuit chip 40 can be prevented. Further, flowing of electromagnetic noise from connector 20 into heatsink 80 is prevented. Electromagnetic noise can be prevented from passing through heatsink 80 and heat transfer material 83 and flowing into first integrated circuit chip 40 and an electronic component other than first integrated circuit chip 40 electrically connected with first ground pattern 11 (for example, an active electronic component such as integrated circuit chip 40b (see FIG. 4) or a light-emitting diode). Malfunction or electrical breakdown of an electronic component electrically connected with first ground pattern 11 (first integrated circuit chip 40 and an electronic component other than first integrated circuit chip 40) can be prevented.

Printed circuit board 1j in the present embodiment further includes heatsink 80, a first heat transfer member (heat transfer material 83), and a second heat transfer member (heat transfer material 84). Heatsink 80 is opposed to first main surface 10a and disposed so as to separate from first main surface 10a. Heatsink 80 is in contact with connector 20. The first heat transfer member is connected to first integrated circuit chip 40 and heatsink 80. The height of first heat transfer member is 1 mm or more. The second heat transfer member has electrical conductivity and is connected to second ground pattern 15 and heatsink 80.

Thus, heatsink 80 can cool connector 20. The parasitic capacitance in the first heat transfer member (heat transfer material 83) is reduced, and electromagnetic noise coupled to first integrated circuit chip 40 is reduced. The second heat transfer member (heat transfer material 84) enables electromagnetic noise from connector 20 (chassis 21) into heatsink 80 to escape to reference potential 59 via second ground pattern 15. Malfunction or electrical breakdown of an electronic component electrically connected with first ground pattern 11 (first integrated circuit chip 40 and an electronic component other than first integrated circuit chip 40) can be prevented.

The first to eighth embodiments and modifications thereof disclosed here should be understood as being illustrative rather than being limitative in all respects. At least two of the first to eighth embodiments and modifications thereof disclosed here may be combined unless a contradiction arises. The scope of the present disclosure is shown not in the foregoing description but in the claims, and it is intended that all modifications that come within the meaning and range of equivalence to the claims are embraced here.

REFERENCE SIGNS LIST 1, 1a, 1b, 1c, 1d, 1e, 1f, 1g, 1h, 1i, 1j printed circuit board, 2, 2j electronic device, 9 printed board, 10 insulating substrate, 10a first main surface, 10b second main surface, 10c, 11a, 11b, 11c outer edge portion, 11 first ground pattern, 12 recess, 13a, 13b first signal line pattern, 13d second signal line pattern, 15 second ground pattern, 16a first ground pattern portion, 16b second ground pattern portion, 20 connector, 21 chassis, 22 receiving section, 23a, 23b, 23c, 23d, 24a, 24b, 24c, 24d terminal, 25a, 25b first connector signal wiring, 25c connector ground wiring, 25d second connector signal wiring, 30 electric cable, 31 connector body, 32 sheath, 33a, 33b, 33c, 33d terminal, 35a, 35b first cable signal wiring, 35c cable ground wiring, 35d second cable signal wiring, 40 first integrated circuit chip, 40b integrated circuit chip, 42a, 42b first signal terminal, 42c first ground terminal, 45 second integrated circuit chip, 46a second signal terminal, 46c second ground terminal, 50, 51, 52, 53 capacitor, 50a, 52a straight line, 54 resistor, 55 conductive wire, 56 fixing member, 57 conductive rod, 59 reference potential, 60 housing, 61, 64, 64a, 64b, 65 noise path, 71 third ground pattern, 71a, 71b, 71c outer edge portion, 73 first conductive via, 75 fourth ground pattern, 77 second conductive via, 80 heatsink, 81 heat dissipating plate, 82 heat dissipating fin, 83, 84 heat transfer material.

The invention claimed is:

1. A printed circuit board comprising:
a printed board including an insulating substrate including a first main surface, a first ground pattern, a second ground pattern, and a first signal line pattern:
a first integrated circuit chip mounted on the printed board:
a connector mounted on the printed board and connectable to an electric cable; and
a first capacitor mounted on the printed board, wherein
in a plan view of the first main surface, the first ground pattern has a wider area than the second ground pattern,
the second ground pattern is separated from the first ground pattern and directly opposed to the first ground pattern in the plan view of the first main surface,
the first signal line pattern is insulated from the first ground pattern and the second ground pattern,
the connector includes a chassis, connector ground wiring inside the chassis, and first connector signal wiring inside the chassis,
the first integrated circuit chip includes a first ground terminal and a first signal terminal,
the first ground terminal is electrically connected with the first ground pattern and opposed to the second ground pattern in the plan view of the first main surface,
the first signal terminal is electrically connected with the first connector signal wiring through the first signal line pattern,
the second ground pattern is electrically connected with the chassis or the connector ground wiring, and
the first capacitor is connected to the first ground pattern and the second ground pattern and disposed on a straight line that defines a shortest distance between the first ground terminal and the second ground pattern in the plan view of the first main surface.

2. The printed circuit board according to claim 1, wherein the shortest distance between the first ground terminal and the second ground pattern is one-tenth or less of an electrical length inside the printed board of electromagnetic noise from the connector.

3. The printed circuit board according to claim 1, wherein the first capacitor is only capacitor that is connected to the first ground pattern and the second ground pattern.

4. The printed circuit board according to claim 1, wherein
the second ground pattern includes a first ground pattern portion and a second ground pattern portion,
the second ground pattern portion protrudes from the first ground pattern portion toward the first ground pattern,
the first ground pattern has a recess receiving the second ground pattern portion,
in the plan view of the first main surface, the first ground terminal is opposed to the second ground pattern portion, and
the first capacitor is connected to the first ground pattern and the second ground pattern portion and disposed on a straight line that defines a shortest distance between the first ground terminal and the second ground pattern portion in the plan view of the first main surface.

5. The printed circuit board according to claim 1, further comprising:
a second integrated circuit chip placed on the printed board; and
a second capacitor mounted on the printed board, wherein
the printed board further includes a second signal line pattern,
the connector further includes second connector signal wiring inside the chassis,
the second integrated circuit chip includes a second ground terminal and a second signal terminal,
the second signal terminal is electrically connected with the second connector signal wiring through the second signal line pattern,
the second ground terminal is electrically connected with the first ground pattern and opposed to the second ground pattern in the plan view of the first main surface, and
the second capacitor is connected to the first ground pattern and the second ground pattern and disposed on a straight line that defines a shortest distance between the second ground terminal and the second ground pattern in the plan view of the first main surface.

6. The printed circuit board according to claim 5, wherein
in the plan view of the first main surface, the first ground pattern includes a first outer edge portion and a second outer edge portion connected to the first outer edge portion and extending in a direction different from the first outer edge portion, the second ground pattern includes a first ground pattern portion extending along the second outer edge portion and a second ground pattern portion extending along the first outer edge portion and connected to the first ground pattern portion, the first capacitor is connected to the first ground pattern and the first ground pattern portion and disposed on a straight line that defines a shortest distance between the first ground terminal and the first ground pattern portion in the plan view of the first main surface, and the second capacitor is connected to the first ground pattern and the second ground pattern portion and disposed on a straight line that defines a shortest distance between the second ground terminal and the second ground pattern portion in the plan view of the first main surface.

7. The printed circuit board according to claim 1, further comprising a second integrated circuit chip, wherein the insulating substrate includes a second main surface opposite the first main surface, the printed board further includes a third ground pattern, a fourth ground pattern, a second signal line pattern, at least one first conductive via, and a second conductive via, the fourth ground pattern is separated from the third ground pattern and is directly opposed to the third ground pattern in the plan view of the first main surface, the second signal line pattern is insulated from the third ground pattern and the fourth ground pattern, the at least one first conductive via is connected to the first ground pattern and the third ground pattern and extends along a direction in which the first main surface and the second main surface are separated from each other, the second conductive via is connected to the second ground pattern and the fourth ground pattern and extends in the direction in which the first main surface and the second main surface are separated from each other, the connector further includes second connector signal wiring inside the chassis, the second integrated circuit chip includes a second ground terminal and a second signal terminal, the second ground terminal is electrically connected with the third ground pattern and opposed to the fourth ground pattern in the plan view of the first main surface, and the second signal terminal is electrically connected with the second connector signal wiring through the second signal line pattern.

8. The printed circuit board according to claim 7, wherein the at least one first conductive via is a plurality of first conductive vias.

9. The printed circuit board according to claim 7, further comprising a second capacitor mounted on the printed board, wherein the second capacitor is connected to the third ground pattern and the fourth ground pattern and disposed on a straight line that defines a shortest distance between the second ground terminal and the fourth ground pattern in the plan view of the first main surface.

10. The printed circuit board according to claim 9, wherein in the plan view of the first main surface, the second capacitor is disposed at a same position as the first capacitor.

11. The printed circuit board according to claim 1, wherein in the plan view of the first main surface, the first ground pattern includes a first outer edge portion and a second outer edge portion connected to the first outer edge portion and extending in a direction different from the first outer edge portion, the second ground pattern includes a first ground pattern portion extending along the second outer edge portion and a second ground pattern portion extending along the first outer edge portion and connected to the first ground pattern portion, the first capacitor is connected to the first ground pattern and the first ground pattern portion and disposed on a straight line that defines a shortest distance between the first ground terminal and the first ground pattern portion in the plan view of the first main surface, and a gap between the first ground pattern portion and the first ground pattern is smaller than a gap between the second ground pattern portion and the first ground pattern.

12. The printed circuit board according to claim 1, wherein the second ground pattern includes a first ground pattern portion and a second ground pattern portion, the second ground pattern portion protrudes from the first ground pattern portion toward the first ground pattern, a gap between the second ground pattern portion and the first ground pattern in a direction of protrusion of the second ground pattern portion from the first ground pattern portion is smaller than a gap between the first ground pattern portion and the first ground pattern in the direction of protrusion, in the plan view of the first main surface, the first ground terminal is opposed to the second ground pattern portion, and the first capacitor is connected to the first ground pattern and the second ground pattern portion and disposed on a straight line that defines a shortest distance between the first ground terminal and the second ground pattern portion and extends along the direction of protrusion.

13. The printed circuit board according to claim 1, further comprising a second capacitor mounted on the printed board, wherein the chassis is a conductive chassis, the second ground pattern includes a first ground pattern portion and a second ground pattern portion separated from the first ground pattern portion, the second ground pattern portion is electrically connected with the conductive chassis, the first capacitor is connected to the first ground pattern and the first ground pattern portion and disposed on a straight line that defines a shortest distance between the first ground terminal and the first ground pattern portion in the plan view of the first main surface, and the second capacitor is connected to the first ground pattern portion and the second ground pattern portion.

14. The printed circuit board according to claim 13, further comprising a resistor mounted on the printed board, wherein the resistor is connected to the first ground pattern portion and the second ground pattern portion, and the second capacitor and the resistor are disposed in parallel between the first ground pattern portion and the second ground pattern portion.

15. The printed circuit board according to claim 1, further comprising:
- a heatsink opposed to the first main surface and disposed so as to separate from the first main surface; and
- a heat transfer member connected to the first integrated circuit chip and the heatsink,
- wherein the heatsink is separated from the connector.

16. The printed circuit board according to claim 1, further comprising:
- a heatsink opposed to the first main surface and disposed so as to be separated from the first main surface;
- a first heat transfer member connected to the first integrated circuit chip and the heatsink; and
- a second heat transfer member connected to the second ground pattern and the heatsink, wherein
- the heatsink is in contact with the connector,
- the first heat transfer member has a height of 1 mm or more, and
- the second heat transfer member has electrical conductivity.

17. The printed circuit board according to claim 1, wherein
- in the plan view of the first main surface, the printed board has a rectangular shape,
- a size of each of sides of the printed board in the plan view of the first main surface is 5 cm or more and 15 cm or less, and
- the first capacitor has a capacity of 0.5 µF or more and 5.0 µF or less.

\* \* \* \* \*

UNITED STATES PATENT AND TRADEMARK OFFICE
CERTIFICATE OF CORRECTION

| | |
|---|---|
| PATENT NO. | : 12,057,414 B2 |
| APPLICATION NO. | : 18/284861 |
| DATED | : August 6, 2024 |
| INVENTOR(S) | : Yusuke Yamakaji |

It is certified that error appears in the above-identified patent and that said Letters Patent is hereby corrected as shown below:

In the Specification

Column 1, Line 26 should be changed from "board and separates from the ground pattern." to - board and is separated from the ground pattern. -

Column 2, Line 3 should be changed from "separates from the first ground pattern" to - is separated from the first ground pattern -

Column 5, Line 11 should be changed from "Second ground pattern 15 separates from" to - Second ground pattern 15 is separated from -

Column 5, Line 62 should be changed from "separates from first ground pattern" to - is separated from first ground pattern -

Column 10, Line 66 should be changed from "board 1 separates from" to - board 1 is separated from -

Column 11, Lines 66-67 should be changed from "separates from first ground pattern" to - is separated from first ground pattern -

Column 14, Line 17 should be changed from "separates from first" to - is separated from first -

Column 14, Line 19 should be changed from "separates from first ground" to - is separated from first ground -

Column 14, Line 45 should be changed from "separates from first" to - is separated from first -

Column 16, Line 4 should be changed from "portion 16b separates from first" to - portion 16b is separated from first -

Signed and Sealed this
Nineteenth Day of November, 2024

Katherine Kelly Vidal
*Director of the United States Patent and Trademark Office*

CERTIFICATE OF CORRECTION (continued)
U.S. Pat. No. 12,057,414 B2

Column 16, Line 6 should be changed from "portion 16b separates from first" to - portion 16b is separated from first -

Column 16, Line 23 should be changed from "13d separates from first" to - 13d is separated from first -

Column 20, Line 30 should be changed from "surface 10b separate from each other" to - surface 10b are separated from each other -

Column 21, Line 32 should be changed from "pattern 75 separates from third ground" to - pattern 75 is separated from third ground -

Column 21, Line 33 should be changed from "ground pattern 75 separates" to - ground pattern 75 is separated -

Column 21, Line 51 should be changed from "separate from each other," to - are separated from each other, -

Column 22, Line 8 should be changed from "Second signal line pattern 13d separates" to - Second signal line pattern 13d is separated -

Column 23, Lines 26-27 should be changed from "separates from third ground pattern" to - is separated from third ground pattern -

Column 23, Line 34 should be changed from "surface 10b separate from each other" to - surface 10b are separated from each other -

Column 23, Line 38 should be changed from "separate from each other." to - are separated from each other. -

Column 25, Line 8 should be changed from "Second ground pattern portion 16b separates" to - Second ground pattern portion 16b is separated -

Column 25, Line 11 should be changed from "second ground pattern portion 16b separates" to - second ground pattern portion 16b is separated -

Column 27, Line 14 should be changed from "Second ground pattern portion 16b separates" to - Second ground pattern portion 16b is separated -

Column 28, Line 39 should be changed from "pattern portion 16b separates" to - pattern portion 16b is separated -

Column 28, Line 41 should be changed from "pattern portion 16b separates" to - pattern portion 16b is separated -

CERTIFICATE OF CORRECTION (continued)
U.S. Pat. No. 12,057,414 B2

Column 28, Line 53 should be changed from "Second ground pattern portion 16b separates" to - Second ground pattern portion 16b is separated -

Column 28, Line 55 should be changed from "pattern portion 16b separates" to - pattern portion 16b is separated -

Column 30, Lines 32-33 should be changed from "portion 16b separating from" to - portion 16b separated from -

Column 31, Line 26 should be changed from "as to separate from first main surface" to - as to be separated from first main surface -

Column 31, Line 47 should be changed from "Heatsink 80 separates from" to - Heatsink 80 is separated from -

Column 32, Line 34 should be changed from "to separate from first" to - to be separated from first -

Column 32, Line 36 should be changed from "Heatsink 80 separates from" to - Heatsink 80 is separated from -

Column 32, Line 56 should be changed from "disposed so as to separate from" to - disposed so as to be separated from -

In the Claims

Column 37, Line 4 should be changed from "so as to separate from" to - so as to be separated from -